US010668873B2

(12) United States Patent
Chitaka et al.

(10) Patent No.: US 10,668,873 B2
(45) Date of Patent: Jun. 2, 2020

(54) HOUSING-SECURING UNIT FOR VEHICLE AND SUBSTRATE-ACCOMMODATION HOUSING

(71) Applicant: DENSO CORPORATION, Kariya, Aichi-pref. (JP)

(72) Inventors: Hiroki Chitaka, Kariya (JP); Masaru Yokota, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 16/073,346

(22) PCT Filed: Nov. 25, 2016

(86) PCT No.: PCT/JP2016/084876
§ 371 (c)(1),
(2) Date: Jul. 27, 2018

(87) PCT Pub. No.: WO2017/130548
PCT Pub. Date: Aug. 3, 2017

(65) Prior Publication Data
US 2019/0031122 A1    Jan. 31, 2019

(30) Foreign Application Priority Data

Jan. 29, 2016    (JP) .................................. 2016-016454

(51) Int. Cl.
*B60R 16/02*    (2006.01)
*B60R 16/023*    (2006.01)
(Continued)

(52) U.S. Cl.
CPC .......... *B60R 16/0215* (2013.01); *B60K 35/00* (2013.01); *B60R 16/0239* (2013.01);
(Continued)

(58) Field of Classification Search
CPC ............ B60R 16/0215; B60R 16/0239; H05K 5/0073; H05K 5/0217; H05K 5/0221
See application file for complete search history.

(56) References Cited

U.S. PATENT DOCUMENTS 7,209,195 B2 * 4/2007 Lin .................... G02F 1/133308
349/58
7,429,700 B2 * 9/2008 Kanamaru ........... H01R 13/506
174/135

(Continued)

FOREIGN PATENT DOCUMENTS

JP        61149380 U    *  9/1986
JP        S61149380 U       9/1986
(Continued)

*Primary Examiner* — Nidhi Thaker
(74) *Attorney, Agent, or Firm* — Harness, Dickey & Pierce, P.L.C.

(57) ABSTRACT

A housing-securing unit for a vehicle includes: a housing in which a circuit board is to be housed; and a bracket through which the housing is mounted to the vehicle. A holding pin having a column shape is provided on a side surface of the housing. The bracket has a side support component in which a through hole is formed for fitting the holding pin. The holding pin has an inclined approach surface having a height that is increased as extending in an assembling direction, and a holding surface formed to regulate the side support component from moving in the assembling direction and to oppose an inner peripheral surface of the through hole when the holding pin is fitted to the through hole. A height of a top part of the holding surface is more than or equal to a height of a top part of the inclined approach surface.

10 Claims, 17 Drawing Sheets

(51) Int. Cl.
  *H05K 5/00*    (2006.01)
  *H05K 5/02*    (2006.01)
  *B60K 35/00*   (2006.01)
  *H05K 5/03*    (2006.01)
  *B60K 37/06*   (2006.01)

(52) U.S. Cl.
  CPC ......... *H05K 5/0073* (2013.01); *H05K 5/0217* (2013.01); *H05K 5/0221* (2013.01); *H05K 5/03* (2013.01); *B60K 37/06* (2013.01)

(56) References Cited

U.S. PATENT DOCUMENTS

| | | | |
|---|---|---|---|
| 8,319,910 B2* | 11/2012 | Park | G02F 1/133308 |
| | | | 349/58 |
| 8,422,220 B2* | 4/2013 | Chen | E05C 19/06 |
| | | | 361/679.58 |
| 8,448,814 B2* | 5/2013 | Yamamoto | B65D 43/0204 |
| | | | 220/315 |
| 9,386,720 B2* | 7/2016 | Yang | H05K 7/1432 |
| 10,111,350 B2* | 10/2018 | Morihara | B60R 16/03 |
| 2012/0106035 A1 | 5/2012 | Chen | |
| 2018/0310421 A1* | 10/2018 | Kato | H05K 5/0204 |

FOREIGN PATENT DOCUMENTS

JP     2005150566 A    6/2005
JP     2009-127732 A   6/2009

\* cited by examiner

HOUSING-SECURING UNIT FOR VEHICLE AND SUBSTRATE-ACCOMMODATION HOUSING

CROSS REFERENCE TO RELATED APPLICATIONS

This application is a U.S. National Phase Application under 35 U.S.C. 371 of International Application No. PCT/JP2016/084876 filed on Nov. 25, 2016 and published in Japanese as WO 2017/130548 A1 on Aug. 3, 2017. This application is based on and claims the benefit of priority from Japanese Patent Application No. 12016-016454 filed on Jan. 29, 2016. The entire disclosures of all of the above applications are incorporated herein by reference.

TECHNICAL FIELD

The present disclosure relates to a housing-securing unit for a vehicle, and a substrate-accommodation housing.

BACKGROUND ART

In many cases, an electronic control unit is attached to a vehicle with a metal bracket manufactured by press processing. Generally, an electronic control unit includes a circuit board for controlling a vehicle, and the circuit board is stored in a case. Before attaching an electronic control unit to a vehicle using a bracket, it is necessary to assemble the bracket to the case.

Patent Literature 1 describes an art by which a bracket can be easily assembled to an electronic control unit. Concretely, the bracket has a support plate part which supports the case by contact with both sides of the case of the electronic control unit, when being attached to the electronic control unit. Each side of the case has a piece of projection, and each support plate part of the bracket has a through hole in which the piece of projection is fitted. The support plate part of the bracket is made in contact with the side of the case, and the bracket is made to approach the case in a regular assembling direction. Then, the support plate part of the bracket passes over the piece of projection, and the piece of projection is fitted into the through hole of the support plate part. The assembling of the bracket is completed when each piece of projection is fitted into the respective through hole.

In Patent Literature 1, the piece of projection is formed such that the support plate part of the bracket can easily pass over the piece of projection in process of assembling the bracket. Specifically, the height of the piece of projection is made to become higher, as a whole, from the front end to the back end in the assembling direction. Therefore, the piece of projection itself has no function of regulating the bracket from further moving in the assembling direction from the state where the piece of projection is fitted with the through hole.

Then, in Patent Literature 1, a stopper for regulating the bracket from further moving in the assembling direction is provided at a predetermined position on the both sides of the case along the assembling direction. If the bracket tries to move in the assembling direction further after the bracket is attached to the case, the end of the support plate part of the bracket is in contact with the stopper, so as to be regulated from moving in the assembling direction.

PRIOR ART LITERATURES

Patent Literature

Patent Literature 1: JP 2005-150566 A

SUMMARY OF INVENTION

In Patent Literature 1, the stopper regulates the bracket from moving in the assembling direction further from the state where the bracket is attached to the case. However, if a big load is applied to the case in the assembling direction by the bracket due to a shock generated by, for example, an accident or other factors of the vehicle, a big shear stress is applied to the stopper by the support plate part of the bracket. This shear stress may exceed an allowable stress of the stopper. Therefore, it may be difficult to apply the art described in Patent Literature 1 to a product which is required to function appropriately even after a shock is applied by a vehicle accident.

If the size of the stopper in the shearing direction (namely, the size in the assembling direction) is increased so as to be able to withstand the big load caused by the shock, the whole dimension of the case is increased. As a result, the vehicle design is affected.

Moreover, a change in the position of the piece of projection is also considered in order to enlarge the size of the stopper in the shearing direction. However, if the position of the piece of projection is changed, the relative location relation between the case and the bracket is changed. As a result, since a relative location relation is also changed between the vehicle and the case attached to the vehicle, the vehicle design may be affected. It is possible to change the form of the bracket in response to the change in the case, such as position change of the piece of projection, such that the relative location relation between the case and the bracket is not changed. However, in this case, it is necessary to change the form of the bracket. When it is required to use an already-existing bracket, it is difficult to adopt a measure with change in design of a bracket.

It is an object of the present disclosure to provide a housing-securing unit for a vehicle, and a substrate-accommodation housing, by which an assembly can be appropriately maintained after a bracket is normally attached to a housing, while a workability can be kept better when the bracket is assembled to the housing.

According to an aspect of the present disclosure, a housing-securing unit for a vehicle includes: a housing in which a circuit board is to be housed; and a bracket for attaching the housing to the vehicle. The bracket is configured to be attached to the housing by approaching a lower surface of the housing in a direction perpendicular to the lower surface. The housing has a plurality of housing sides perpendicular to the lower surface. At least one of the housing sides has a holding pin projected in a direction perpendicular to the housing side.

The bracket has a side support component shaped in a board in which a through hole is formed for fitting the corresponding holding pin. The bracket is made to approach the housing in a state where the side support component is parallel to the housing side having the corresponding holding pin. The bracket is configured to complete being attached to the housing such that a tip part of the side support component in the assembling direction is in contact with the holding pin and passes over the holding pin and that the holding pin is fitted into the through hole of the side support component.

The holding pin has an inclined approach surface and at least one holding surface. The inclined approach surface has a height that is increased as extending in the assembling direction, and the tip part of the side support component is firstly in contact with the inclined approach surface when the bracket is attached to the housing. The holding surface is formed to regulate the side support component from further moving in the assembling direction when the holding pin is fitted to the through hole of the side support component. That is, the holding surface is visible when being seen from the exterior in the assembling direction, and is formed to oppose an inner peripheral surface of the through hole when the holding pin is fitted to the through hole. The height of the top part of the holding surface is more than or equal to the height of the top part of the inclined approach surface.

According to the housing-securing unit for a vehicle configured in this way, when attaching the bracket to the housing, the tip part of the side support component of the bracket is in contact with the inclined approach surface of the holding pin, and passes over the holding pin. Therefore, the bracket can be easily moved in the assembling direction in the work attaching to the housing.

Furthermore, after the completion of attachment, even if the bracket tries to further move in the assembling direction, the motion is regulated by the holding surface of the holding pin. That is, even if the bracket tries to further move in the assembling direction, the motion is regulated by the inner peripheral surface of the through hole of the side support component that is in contact with the holding surface of the holding pin.

Therefore, according to the housing-securing unit, the workability can be kept better when the bracket is assembled to the housing, and the assembly can be maintained appropriately after the bracket is normally attached to the housing.

In addition, the "lower surface" of the housing represents a surface of the sides of the housing opposing the bracket, when the bracket is attached. Moreover, the "height" represents a length from the housing side on which the holding pin is prepared, in the perpendicular direction perpendicular to the housing side. The "top part" is a portion where the height is the maximum. Moreover, the tip part of the side support component in the assembling direction is a portion of the side support component that firstly makes a contact with the inclined surface of the holding pin in the attachment process. Moreover, "perpendicular" is not restricted to be strictly perpendicular, and may not strictly be perpendicular as long as generating the target effect. Moreover, "parallel" is not restricted to be strictly parallel, and may not strictly be parallel as long as generating the target effect.

DESCRIPTION OF EMBODIMENTS

Figure 1:
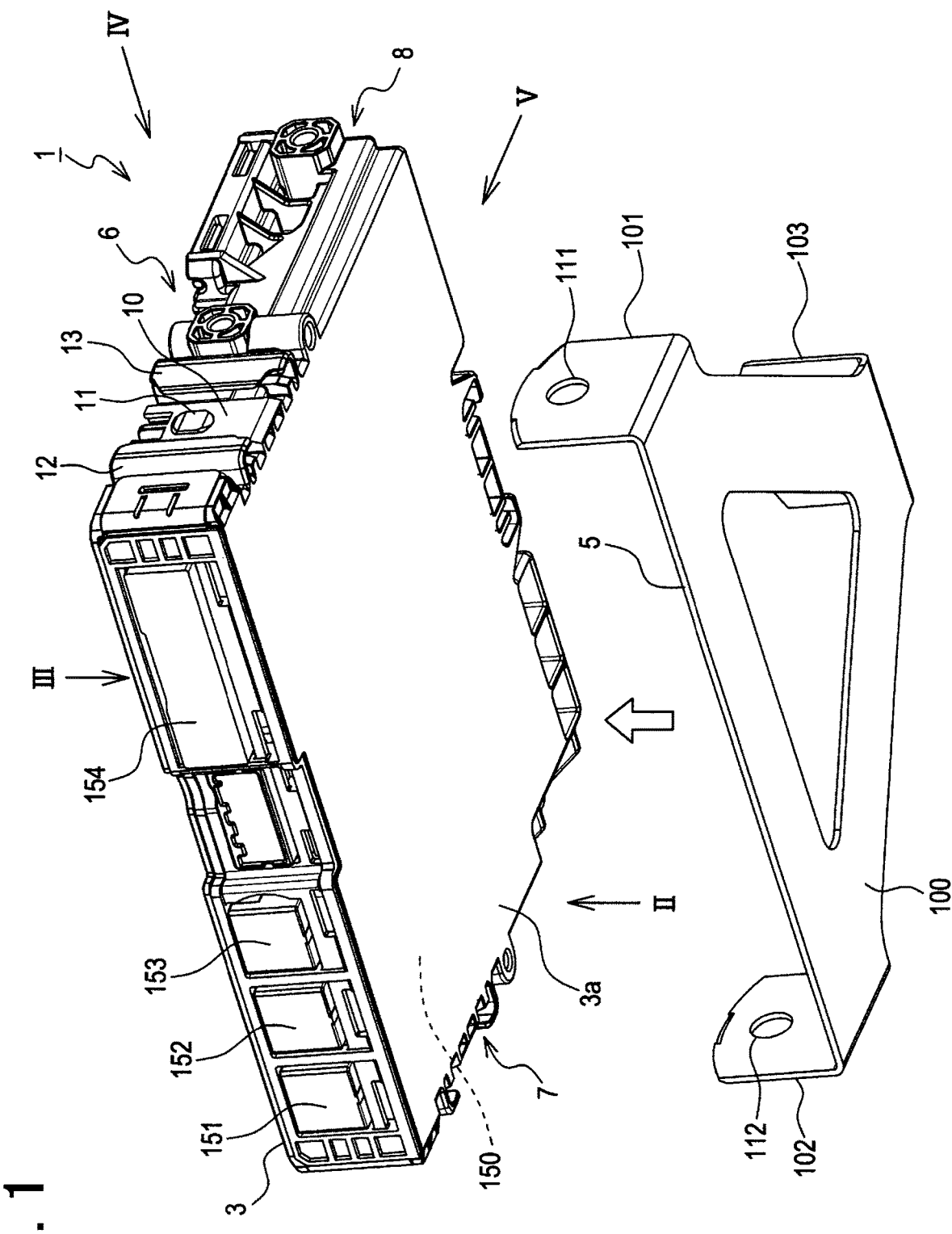
FIG. 1 is a perspective view illustrating a housing-securing unit for a vehicle according to an embodiment in a state where a bracket is not attached to a housing.

Hereafter, an embodiment is explained referring to the drawings.

(1) Outline of Housing-Securing Unit for Vehicle

A housing-securing unit 1 for a vehicle of this embodiment is explained with reference to FIG. 1-FIG. 6. As shown in FIG. 1, the housing-securing unit 1 includes a housing 3 and a bracket 5. In this embodiment, the housing 3 is a product made of resin. As shown in FIG. 1, the housing 3 has an approximately rectangular parallelepiped form as a whole. That is, the housing 3 has a lower surface 3a where the surface area is relatively large, four sides perpendicular to the lower surface 3a, and an upper surface 3b (refer to FIG. 3).

Figure 2:
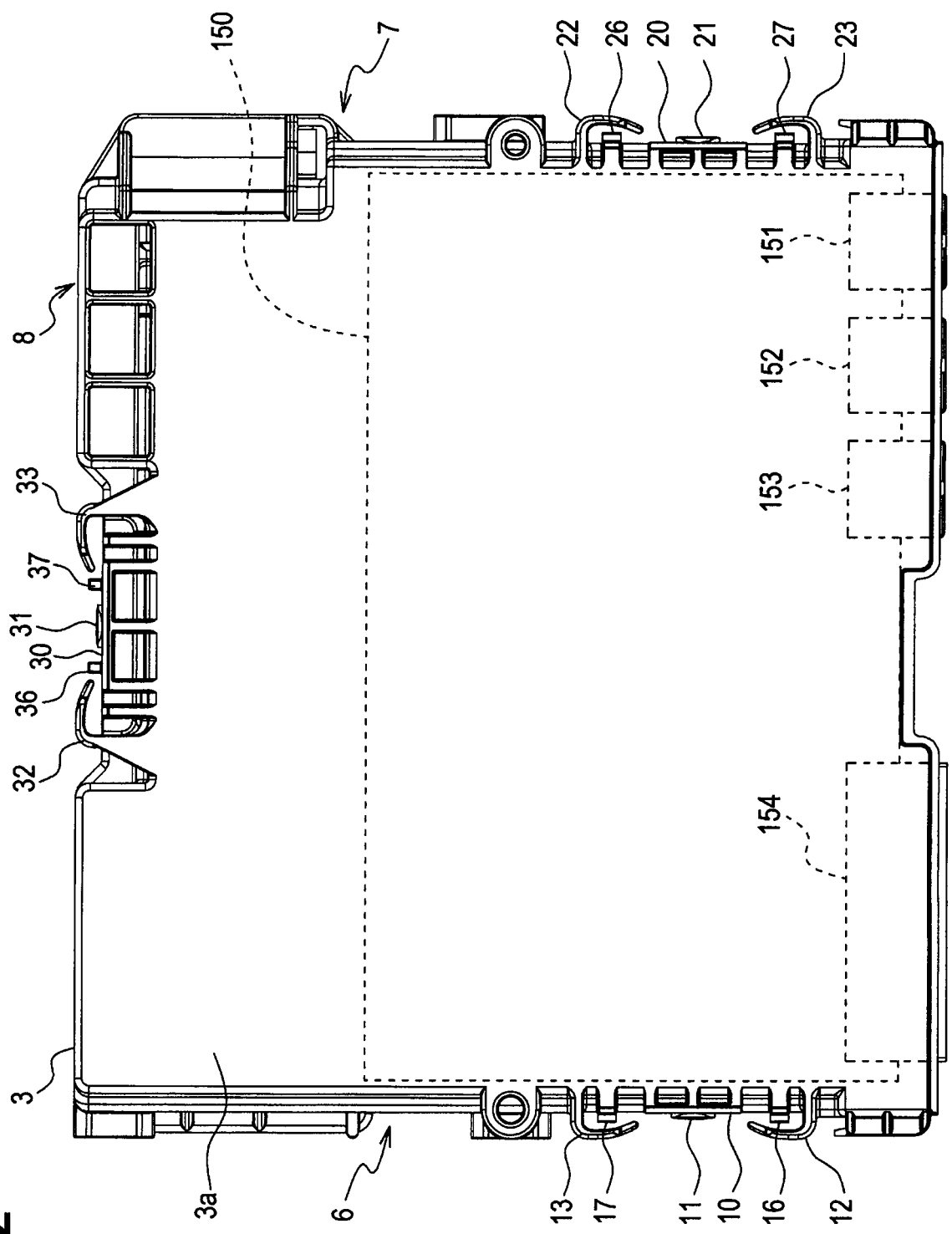
FIG. 2 is a view seen in an arrow direction II of FIG. 1.

As shown by a dashed line in FIG. 1 and FIG. 2, a circuit board 150 is housed in the housing 3, and has a function of controlling the vehicle (not shown). The vehicle includes all kinds of unit that can run with wheels rotated by various kinds of sources, such as an internal-combustion engine and/or an electric motor. The control means not only various kinds of control directly in connection with the running of the vehicle but also various kinds of control which is not directly concerned or not concerned at all with the running of the vehicle. That is, the control is a concept including all the kinds of control realized in the vehicle.

The control directly in connection with the running of the vehicle includes, for example, a control of an internal-combustion engine in a vehicle which has the internal-combustion engine as a driving source, a control of an electric motor in a vehicle which has the electric motor as a driving source, a control of a gearbox, a control of a brake equipment, and a control of a power-steering equipment. The control which is not directly concerned or not concerned at all with the running of the vehicle includes, for example, a control of various lights, a control of a power window, a control of an air bag, a control of an air-conditioner, and a control of a navigation system.

The circuit board 150 housed in the housing 3 has an electronic circuit for realizing at least one kind of specific control. As shown by a dashed line in FIG. 1 and FIG. 2, the circuit board 150 has plural connector sockets 151, 152, 153, 154 for electrically connecting the circuit board 150 with the exterior.

Figure 3:
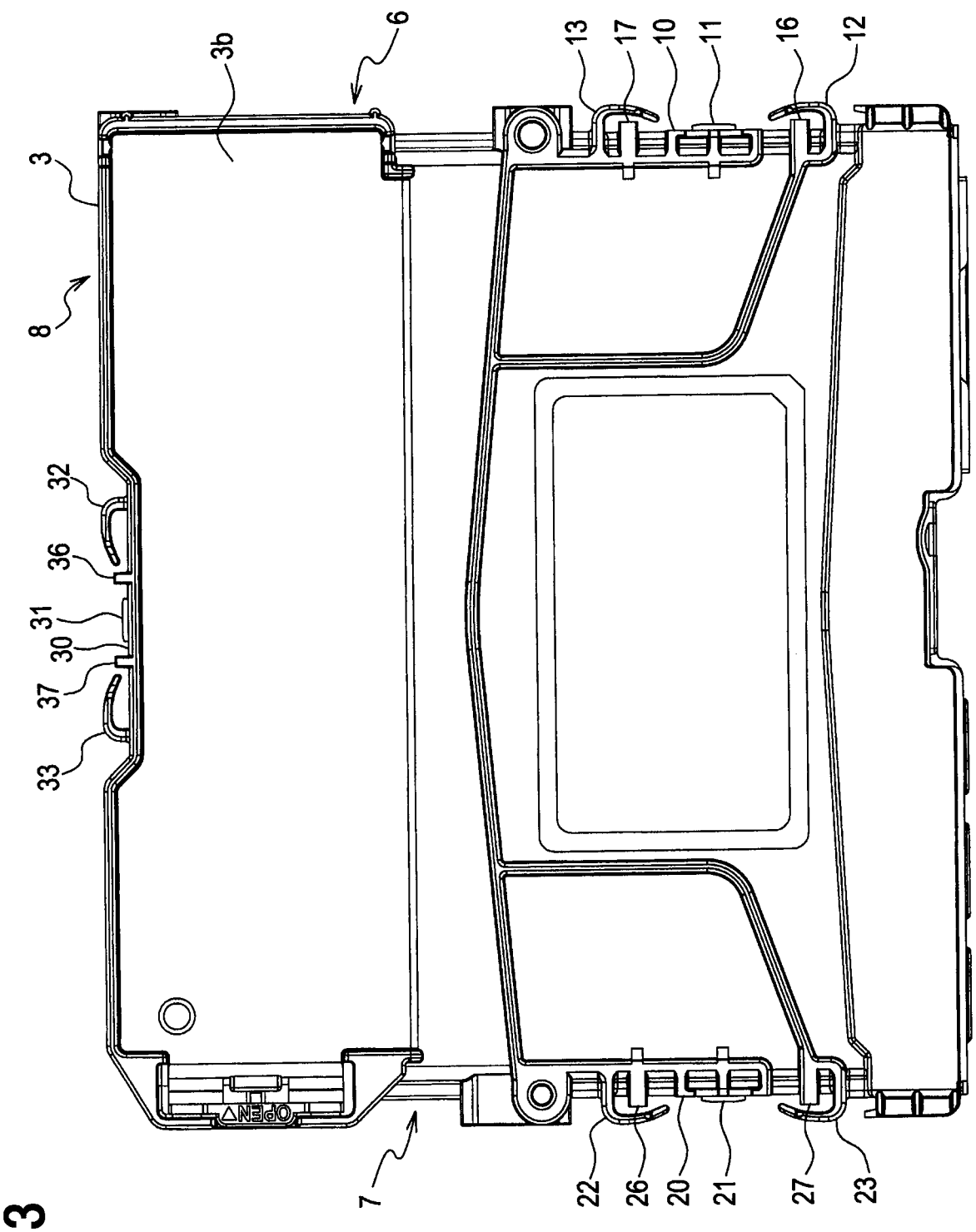
FIG. 3 is a view seen in an arrow direction III of FIG. 1.
Figure 4:
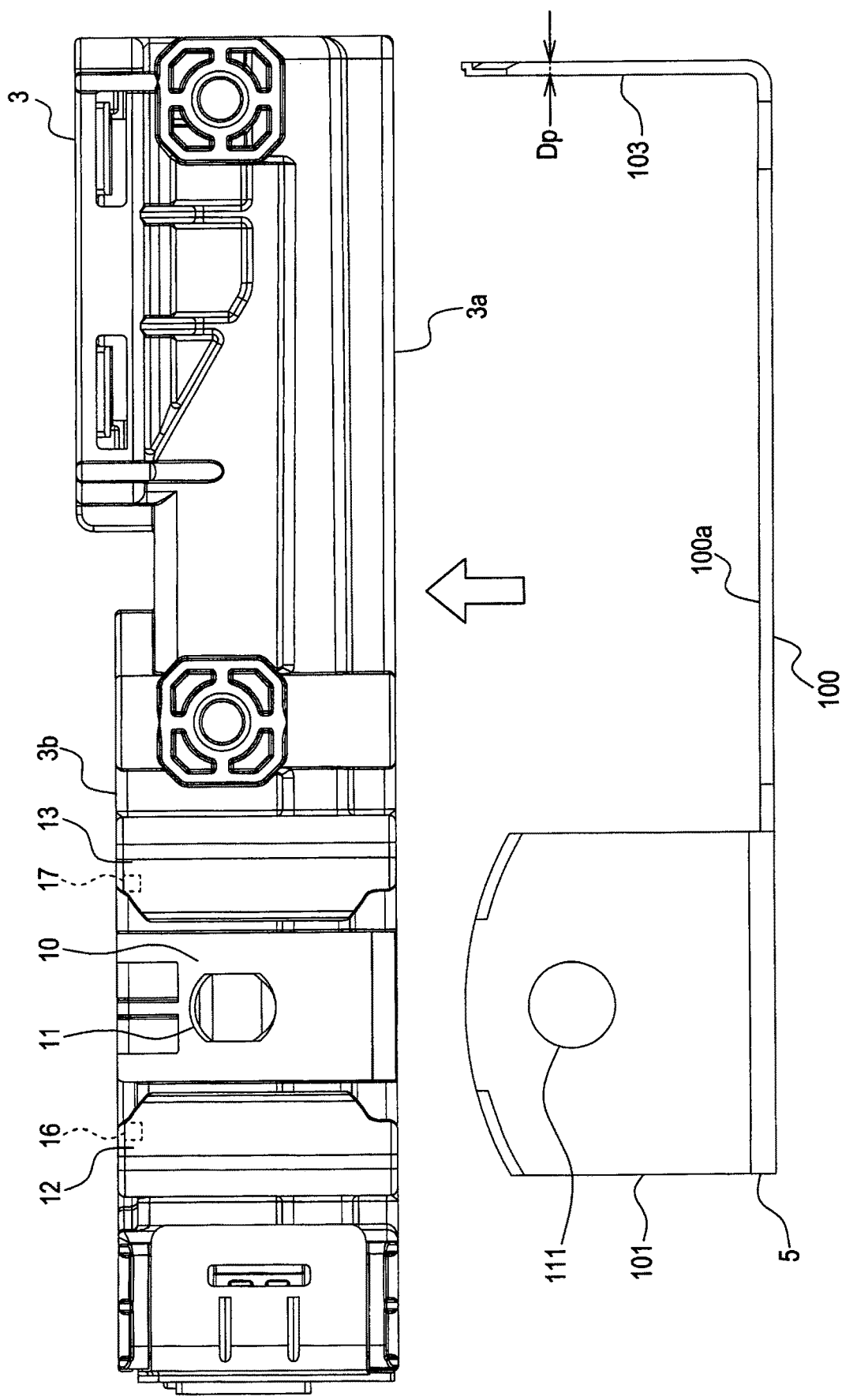
FIG. 4 is a view seen in an arrow direction IV of FIG. 1.
Figure 5:
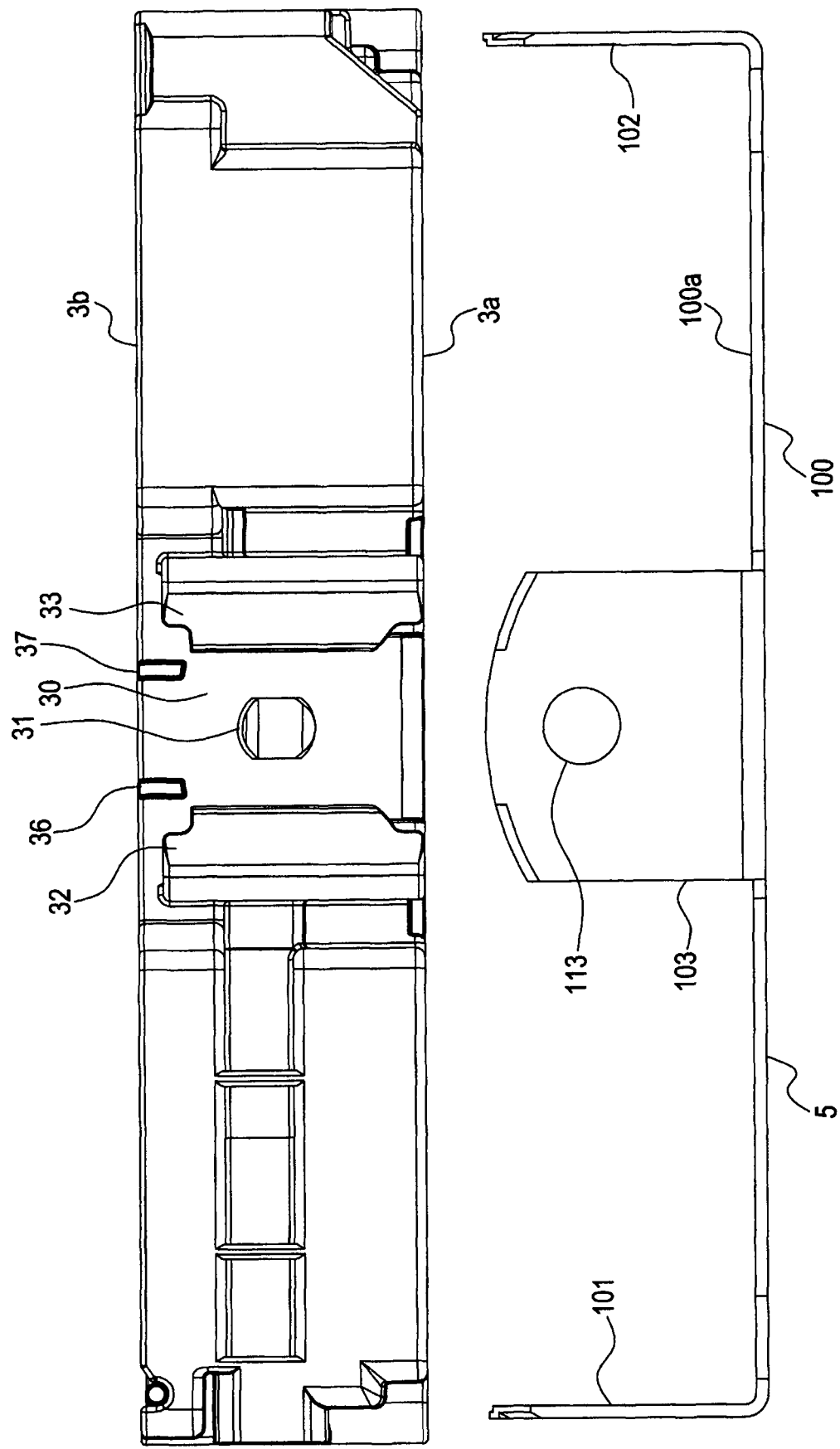
FIG. 5 is a view seen in an arrow direction V of FIG. 1.

As shown in FIG. 1-FIG. 4, a first side 6 that is one of the four sides of the housing 3 has a first holding pin 11 with a column shape projected in a direction perpendicular to the first side 6. As shown in FIG. 2 and FIG. 3, a second side 7 opposing the first side 6, among the four sides of the housing 3, has a second holding pin 21 with a column shape projected in a direction perpendicular to the second side 7. As shown in FIG. 2, FIG. 3, and FIG. 5, among the four sides of the housing 3, a third side 8 has a third holding pin 31 with a column shape projected in a direction perpendicular to the third side 8.

In this embodiment, each of the holding pins 11, 21, 31 is made of resin. That is, each of the holding pins 11, 21, 31 is formed integrally with resin as whole of the housing 3. However, the housing 3 is not limited to be made of resin, and may be formed of other materials other than resin. The material of each holding pin 11, 21, 31 may be different from the material of the side on which the holding pin is formed. For example, each side may be made of resin, and each holding pin 11, 21, 31 may be made of metal.

The bracket 5 is used to attach the housing 3 to a predetermined part of the vehicle. That is, the bracket 5 is attached to be in direct contact with the vehicle, and the housing 3 is attached to the vehicle through the bracket 5. The bracket 5 is attached to the housing 3 by approaching the lower surface 3a of the housing 3 in the direction perpendicular to the lower surface 3a of the housing 3. Alternatively, the bracket 5 can be attached to the housing 3 also by making the housing 3 to approach the bracket 5. There may be various concrete methods by which the housing 3 and the bracket 5 are made to approach relatively.

In the following explanation, for easy understanding, as long as there is no notice, the bracket 5 is assembled to the housing 3 by making the bracket 5 to approach the lower surface 3a in the direction perpendicular to the lower surface 3a relative to the housing 3 that is in the stationary state. The approaching direction, i.e., the direction perpendicular to the lower surface 3a to approach the lower surface 3a, is hereafter called as an assembling direction. A direction opposite to the assembling direction, i.e., the direction perpendicular to the lower surface 3a to separate from the lower surface 3a, is hereafter called as a detachment direction.

Figure 6:
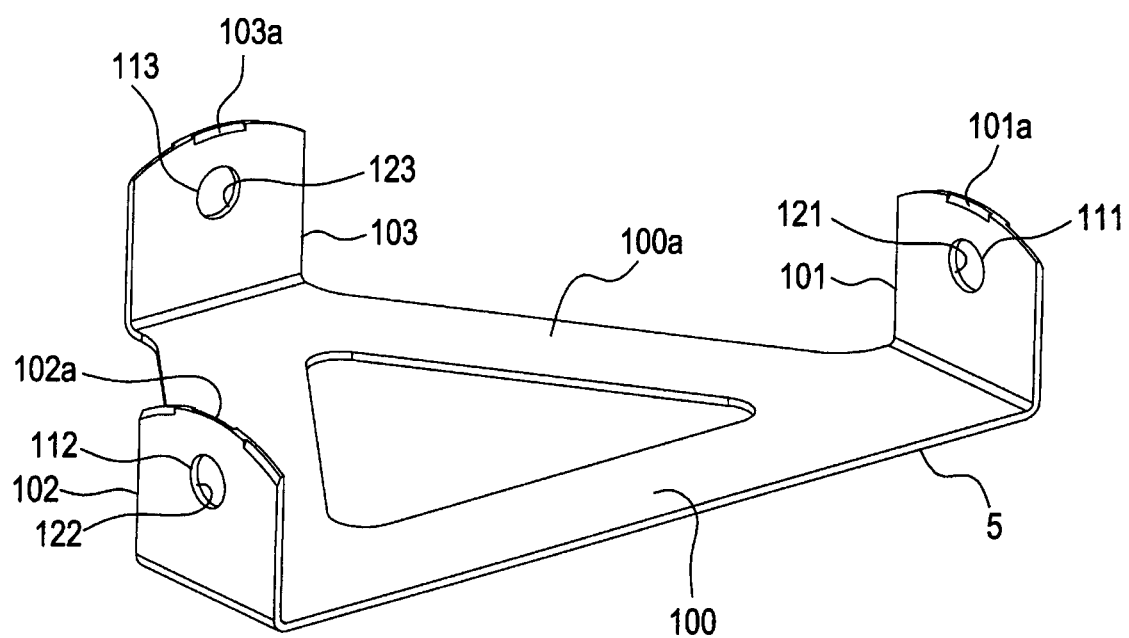
FIG. 6 is a perspective view illustrating the bracket of the embodiment.

As shown in FIG. 1 and FIG. 6, the bracket 5 has a fixed component 100 and three support components 101, 102, 103. The fixed component 100 and the three support components 101, 102, 103 are formed integrally as a sheet metal on which a press processing is carried out.

The fixed component 100 has an isosceles triangle board shape in which the central part is removed. Of the three support components 101, 102, 103, the first support component 101 and the second support component 102 are positioned to correspond to the respective ends of the base in the fixed component 100 having the isosceles triangle shape, and are perpendicular to the board surface of the fixed component 100. The third support component 103 is perpendicular to the board surface of the fixed component 100, and is positioned to correspond to the vertex in the fixed component 100 having the isosceles triangle shape.

The three support components 101, 102, 103 are all the same in the form, and a through hole is formed in each of the three support components 101, 102, 103. That is, a first through hole 111 is formed in the first support component 101, a second through hole 112 is formed in the second support component 102, and a third through hole 113 is formed in the third support component 103.

When the bracket 5 is attached to the housing 3, the first holding pin 11 formed on the first side 6 of the housing 3 is fitted into the first through hole 111. When the bracket 5 is attached to the housing 3, the second holding pin 21 formed on the second side 7 of the housing 3 is fitted into the second through hole 112. When the bracket 5 is attached to the housing 3, the third holding pin 31 formed on the third side 8 of the housing 3 is fitted into the third through hole 113.

Figure 7:
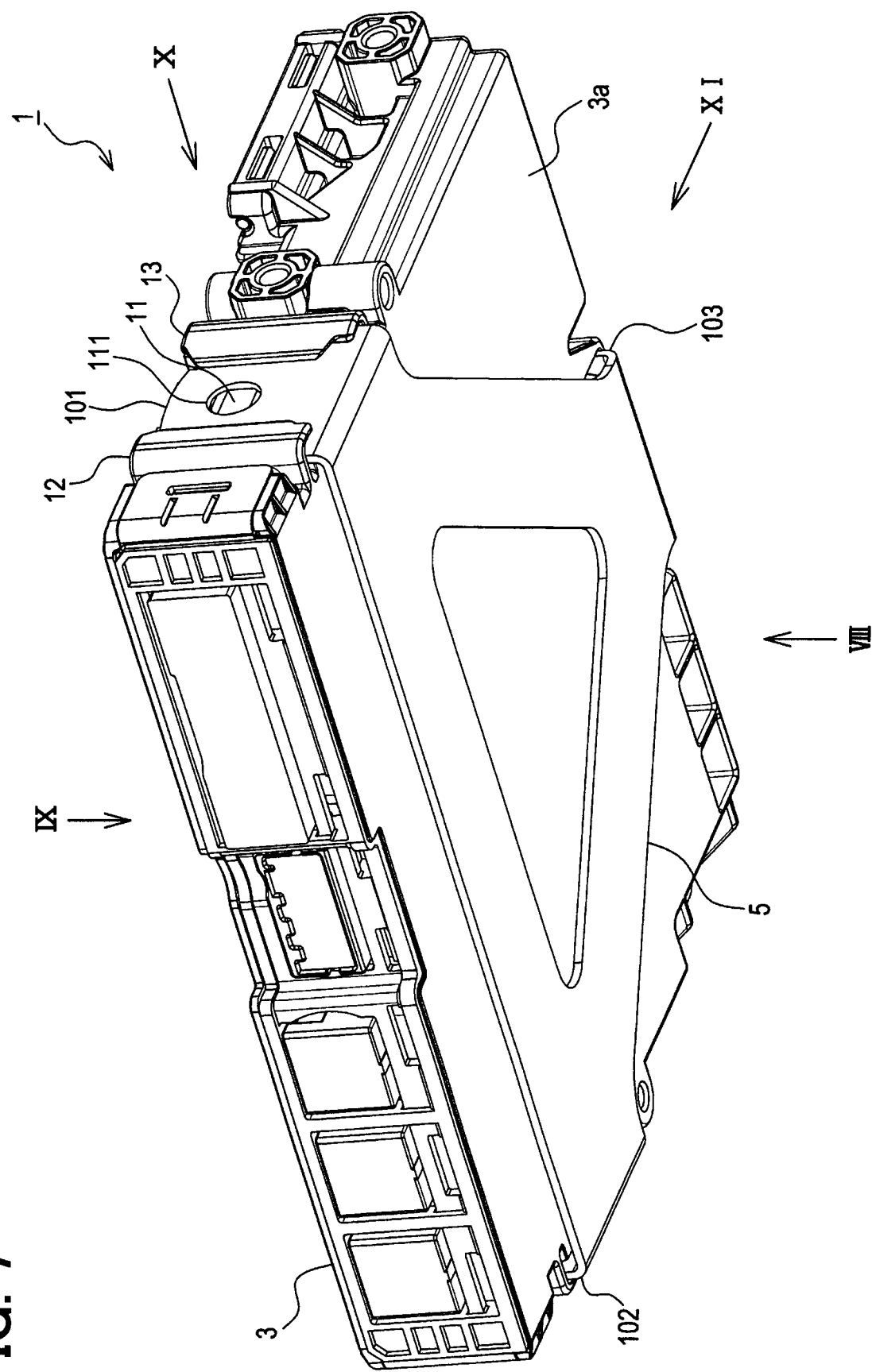
FIG. 7 is a perspective view illustrating the housing-securing unit for a vehicle in a state where the bracket is attached to the housing.

The three support components 101, 102, 103 are in the positional relationship respectively corresponding to the holding pins 11, 21, 31 of the housing 3, and are formed integrally through the fixed component 100. That is, when the bracket 5 is attached to the housing 3, as shown in FIG. 7 to be mentioned later, the first support component 101 of the bracket 5 is in contact with the first side 6 of the housing 3 in the state opposing in parallel, and the first holding pin 11 is fitted into the first through hole 111. At this time, the inner peripheral surface 121 of the first through hole 111 is in the state opposing the side surface of the first holding pin 11.

At this time, although not directly shown in FIG. 7, the second support component 102 of the bracket 5 is also in contact with the second side 7 of the housing 3 in the state opposing in parallel, and the second holding pin 21 is fitted into the second through hole 112. At this time, the inner peripheral surface 122 of the second through hole 112 is in the state opposing the side surface of the second holding pin 21. The third support component 103 of the bracket 5 is also in contact with the third side 8 of the housing 3 in the state opposing in parallel, and the third holding pin 31 is fitted into the third through hole 113. At this time, the inner peripheral surface 123 of the third through hole 113 is in the state opposing the side surface of the third holding pin 31.

The inner peripheral surfaces 121, 122, 123 of the through holes 111, 112, 113 are respectively perpendicular to the board surface of the support components 101, 102, 103. However, the inner peripheral surface 121, 122, 123 is not limited to be perpendicular to the board surface of the support component 101, 102, 103.

The support components 101, 102, 103 have the same thickness Dp. FIG. 4 illustrates the thickness Dp of the third support component 103.

In this embodiment, the bracket 5 is made of metal. More specifically, the bracket 5 is formed with a steel plate or an aluminum alloy board. However, the material of the bracket 5 is not limited. For example, a bracket formed of other materials other than metal, such as resin, may be used.

(2) Configuration of Housing

The sides 6, 7, 8 of the housing 3 are explained more concretely, on which the holding pins 11, 21, 31 are formed respectively.

The first holding pin 11 is formed on the first side 6. As shown in FIG. 1-FIG. 4 for details, the first side 6 has a pin formation side 10 which is a part of the first side 6, and the first holding pin 11 is projected from the pin formation side 10. Insertion guides 12 and 13 formed on the first side 6 are located on the respective sides of the first holding pin 11.

Each of the insertion guides 12 and 13 has the following four functions at least. As a first function, when the bracket 5 is attached to the housing 3, the insertion guide 12, 13 guides the first support component 101 of the bracket 5 in the assembling direction, maintaining the state parallel to the pin formation side 10. As a second function, the insertion guide 12, 13 restricts the first support component 101 from separating outward from the first side 6. More specifically, after the first holding pin 11 was fitted to the first through hole 111 of the first support component 101, the first holding pin 11 is restricted from falling out from the first through hole 111 by the separation of the first support component 101 from the first side 6 in the perpendicular direction. As a third function, the insertion guide 12, 13 restricts the first support component 101 from shifting in the lateral direction. As a fourth function, the insertion guide 12, 13 restricts the first support component 101 from rotating in the state where the first holding pin 11 is fitted to the first through hole 111. The rotating here means a rotation in the circumferential direction, along the inner peripheral surface 121 of the first through hole 111. An insertion space is formed between the first side 6 and each of the insertion guides 12 and 13, for inserting the first support component 101 of the bracket 5.

In the process attaching the bracket 5 to the housing 3, the respective ends of the first support component 101 of the bracket 5 are inserted in each insertion space formed by the insertion guide 12, 13. The first support component 101 is guided in the assembling direction in the state where the respective ends are inserted in each insertion guide 12, 13. Finally, the first holding pin 11 is fitted into the first through hole 111.

As shown in FIG. 2-FIG. 4, stoppers 16 and 17 are formed on the first side 6, at the positions respectively opposing the insertion guides 12 and 13, near the upper surface 3b. Each of the stoppers 16 and 17 is provided to regulate the first support component 101 from further moving in the assembling direction (henceforth, fault penetration), after the bracket 5 was attached to the housing 3, namely after the first holding pin 11 was fitted to the first through hole 111 of the first support component 101 of the bracket 5. In this embodiment, the first holding pin 11 itself has the function of regulating the fault penetration of the first support component 101. Therefore, it is not indispensable to form the stoppers 16 and 17. In this embodiment, the stoppers 16 and 17 are formed to heighten the effect of regulating the fault penetration of the first support component 101.

The configuration of the second holding pin 21 and its circumference on the second side 7 is fundamentally the same as the first holding pin 11 and its circumference on the first side 6. That is, as shown in FIG. 2 and FIG. 3, the second side 7 has a pin formation side 20 which is a part of the second side 7, and the second holding pin 21 is projected from the pin formation side 20. Insertion guides 22 and 23 formed on the second side 7 are located on the respective sides of the second holding pin 21.

Stoppers 26 and 27 are formed on the second side 7 at positions opposing the insertion guides 22 and 23, respectively, near the upper surface 3b of the housing 3. It is not indispensable to form the stoppers 26 and 27.

The third holding pin 31 and its circumference on the third side 8 are substantially the same for obtaining the same action and effect as the first side 6, although the detailed configuration such as the position of the stopper and the form of the insertion guide is partially different from the first holding pin 11 and its circumference on the first side 6.

That is, as shown in FIG. 2 and FIG. 3, the third side 8 has a pin formation side 30 which is a part of the third side 8, and the third holding pin 31 is projected from the pin formation side 30. Insertion guides 32 and 33 formed on the third side 8 are located on the respective sides of the third holding pin 31, for inserting the third support component 103 of the bracket 5 in the assembling direction.

Stoppers 36 and 37 are formed at the end of the pin formation side 30 adjacent to the upper surface 3b of the housing 3. The stoppers 36 and 37 are provided to regulate a fault penetration of the third support component 103 after the bracket 5 was attached to the housing 3, namely, after the third holding pin 31 was fitted to the third through hole 113 of the third support component 103 of the bracket 5. It is not indispensable to form the stoppers 36 and 37.

(3) Assembling of Bracket to Housing

The bracket 5 is assembled to the housing 3 by approaching each other from the positional state shown in FIG. 1. That is, at the attachment time, the bracket 5 is arranged to the housing 3, so that the housing-opposing side 100a is in a state parallel to the lower surface 3a of the housing 3. The housing-opposing side 100a is a surface of the fixed component 100 adjacent to the support component 101, 102, 103. Moreover, the bracket 5 is arranged to the housing 3 so that the three support components 101, 102, 103 become parallel to the sides of the housing 3, respectively.

After the housing 3 and the bracket 5 are arranged in the above-described positional relationship (namely, positional relationship shown in FIG. 1), when the bracket 5 is made to approach the housing 3 in the assembling direction, the support components 101, 102, 103 of the bracket 5 are respectively inserted in the corresponding insertion spaces defined between the side 6, 7, 8 and the insertion guide. When the bracket 5 is moved in the assembling direction as it is, the support components 101, 102, 103 are moved inside the respective insertion spaces in the assembling direction. That is, each of the support components 101, 102, 103 is guided by the insertion guide in the assembling direction.

When the bracket 5 further advances in the assembling direction, the tip end of the support component 101, 102, 103 in the assembling direction is made in contact with the corresponding holding pin, and passes over the corresponding holding pin. The bracket 5 is specified and designed, for example, as shown in FIG. 9, so that the three support components 101, 102, 103 are in contact with and parallel to the corresponding sides of the housing 3 in the state where the attachment to the housing 3 is completed.

Therefore, in the process in which the tip part of the support component 101, 102, 103 passes over the holding pin, each of the support components 101, 102, 103 is elastically deformed in the direction separating from the side of the housing 3 by receiving the reaction force from the holding pin in the direction perpendicular to the side of the housing.

Figure 9:
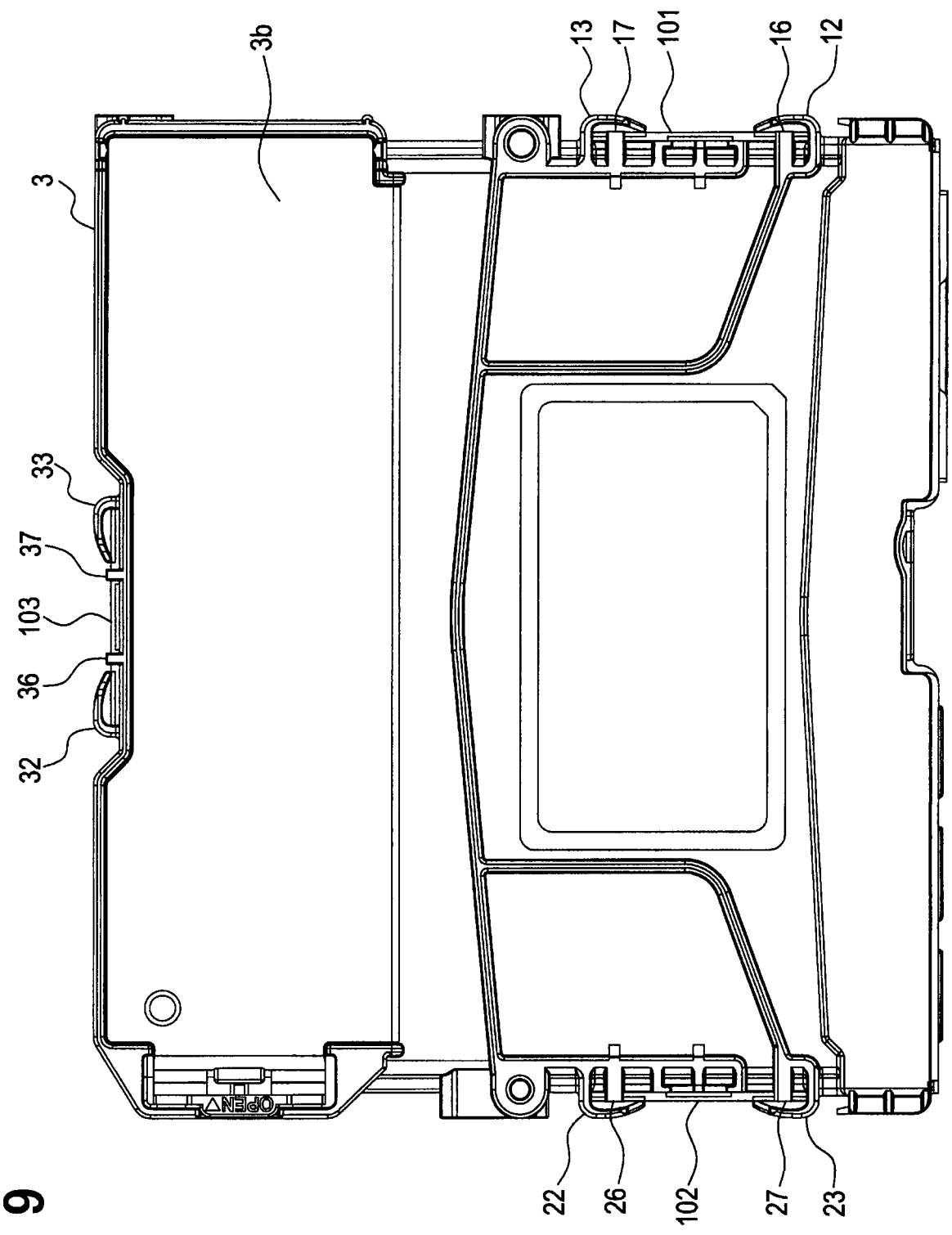
FIG. 9 is a view seen in an arrow direction IX of FIG. 7.

Each insertion guide prepared on the respective sides of the holding pin is, for example, as shown in FIG. 9, designed to be in the state where the side part of the insertion guide adjacent to the holding pin is in contact with the surface of the support component (opposite from the surface opposing the side of the housing) when the attachment of the bracket to the housing 3 is completed. That is, each insertion guide is designed to guide the support component in the assembling direction, in the surface contact state with the side of the housing.

Therefore, at the attachment time, when the support component 101, 102, 103 is separated from the side of the housing in the process where the tip end of each support component 101, 102, 103 passes over the holding pin, each insertion guide is elastically deformed by the force received from the support component, so that the side part of the insertion guide adjacent to the holding pin separates from the side of the housing.

When each support component 101, 102, 103 passes over the corresponding holding pin, and progresses further in the assembling direction, finally, the holding pin is fitted into each through hole 111, 112, 113 of each support component 101, 102, 103. When the holding pins 11, 21, 31 are fitted into the through holes 111, 112, 113, respectively, the attachment of the bracket 5 to the housing 3 is completed.

As shown in FIG. 6, a tip slope 101a is formed in the tip side of the first support component 101 of the bracket 5. The tip slope 101a is formed in order that the first support component 101 can smoothly pass over the first holding pin 11 in process of attaching the bracket 5.

However, in this embodiment, as described later using FIG. 12, an inclined approach surface 61 is formed at the separation side of the first holding pin 11, so that the first support component 101 can smoothly pass over the first holding pin 11. Therefore, it is not indispensable to form the tip slope 101a in the tip side of the first support component 101 of the bracket 5.

Tip slopes 102a and 103a are formed respectively also in the tip sides of the second support component 102 and the third support component 103 of the bracket 5. The form and the function of each tip slope 102a, 103a are the same as the first tip slope 101a.

When the attachment of the bracket 5 to the housing 3 is completed, there is provided the state shown in FIG. 7-FIG. 11. That is, as shown in FIG. 7-FIG. 10, the first support component 101 of the bracket 5 is in a state parallel to the first side 6 of the housing 3, and the both ends are inserted in the insertion space defined by each insertion guide 12, 13. Furthermore, the first holding pin 11 is fitted into the first through hole 111 of the first support component 101.

The height of the stopper 16, 17 formed in the first side 6 is a little higher than the thickness Dp of the first support component 101. Therefore, as shown in FIG. 8 and FIG. 9, when the housing 3 is seen in the assembling direction and in the detachment direction, the stopper 16, 17 is projected outward a little from the first support component 101, in the direction perpendicular to the first side 6.

Figure 8:
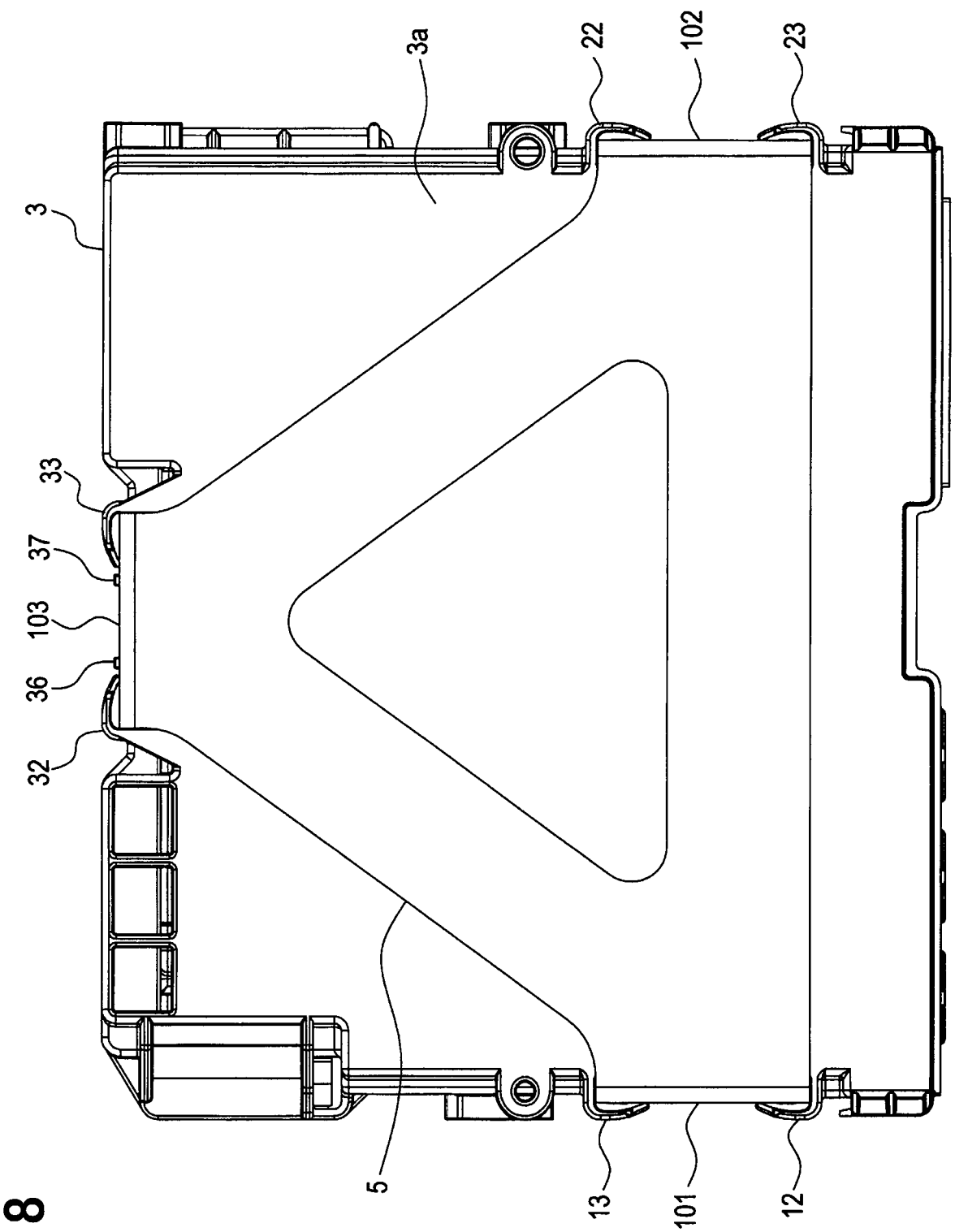
FIG. 8 is a view seen in an arrow direction VIII of FIG. 7.

The relation between the second support component 102 of the bracket 5 and the second side 7 of the housing 3 is, as shown in FIG. 8 and FIG. 9, the same as the relation between the first support component 101 and the first side 6.

Figure 11:
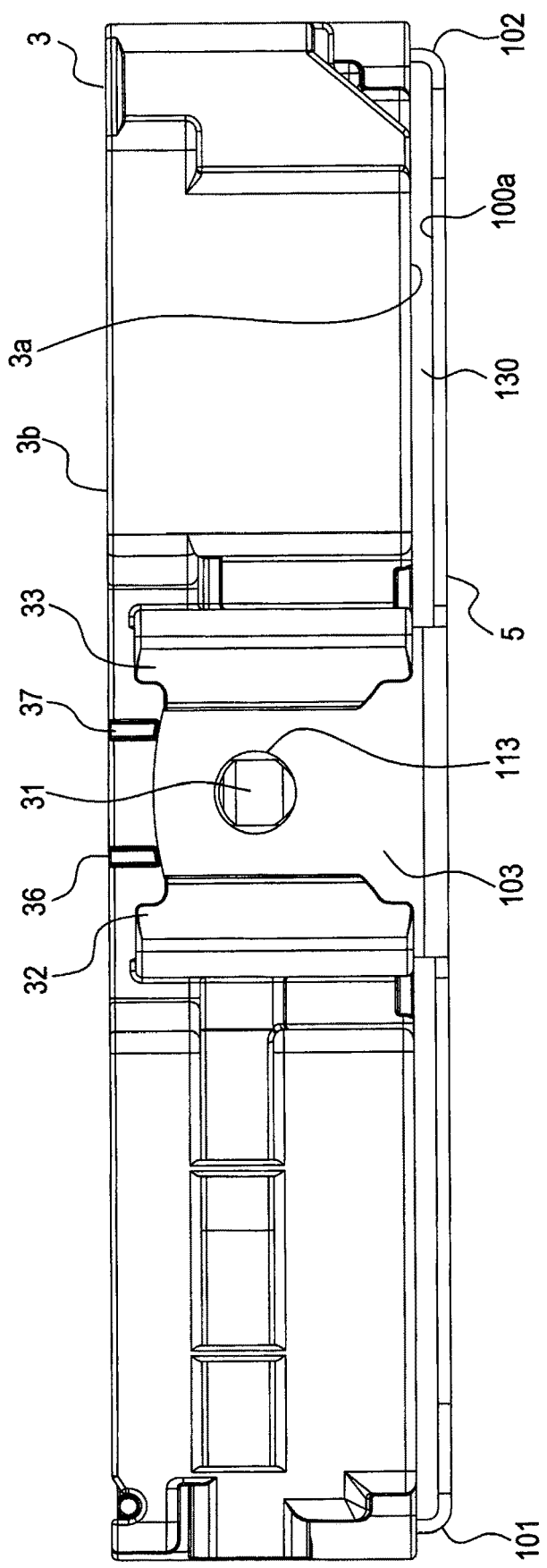
FIG. 11 is a view seen in an arrow direction XI of FIG. 7.

As shown in FIG. 8, FIG. 9, and FIG. 11, the third support component 103 of the bracket is in a state parallel to the third side 8 of the housing 3, and the both ends are inserted in the insertion space defined by each insertion guide 32, 33. Furthermore, the third holding pin 31 is fitted into the third through hole 113 of the third support component 103. In addition, the height of the stopper 36, 37 formed in the third side 8 is higher than the thickness Dp of the third support component 103. Therefore, as shown in FIG. 8 and FIG. 9, when the housing 3 is seen in the assembling direction and in the detachment direction, the stopper 36, 37 is projected outward from the third support component 103, in the direction perpendicular to the third side 8.

The insertion guide restricts the support component 101, 102, 103 from separating in the direction perpendicular to the side of the housing. That is, even if the support component is being tried to separate from the side of the housing perpendicularly, the surface of the support component is in contact with the side part of the insertion guide to regulate the separating motion. Therefore, the fitting state of the holding pin in the through hole is maintained. In this embodiment, each of the support components 101, 102, 103 is formed integrally with the fixed component 100. As mentioned above, the support component 101, 102, 103 is designed to be in the state parallel to and contact with the corresponding side of the housing 3, when the attachment to the housing 3 is completed. Therefore, such configuration of the bracket 5 itself produces the effect of regulating each support component 101, 102, 103 from separating perpendicularly from the side of the housing.

Figure 10:
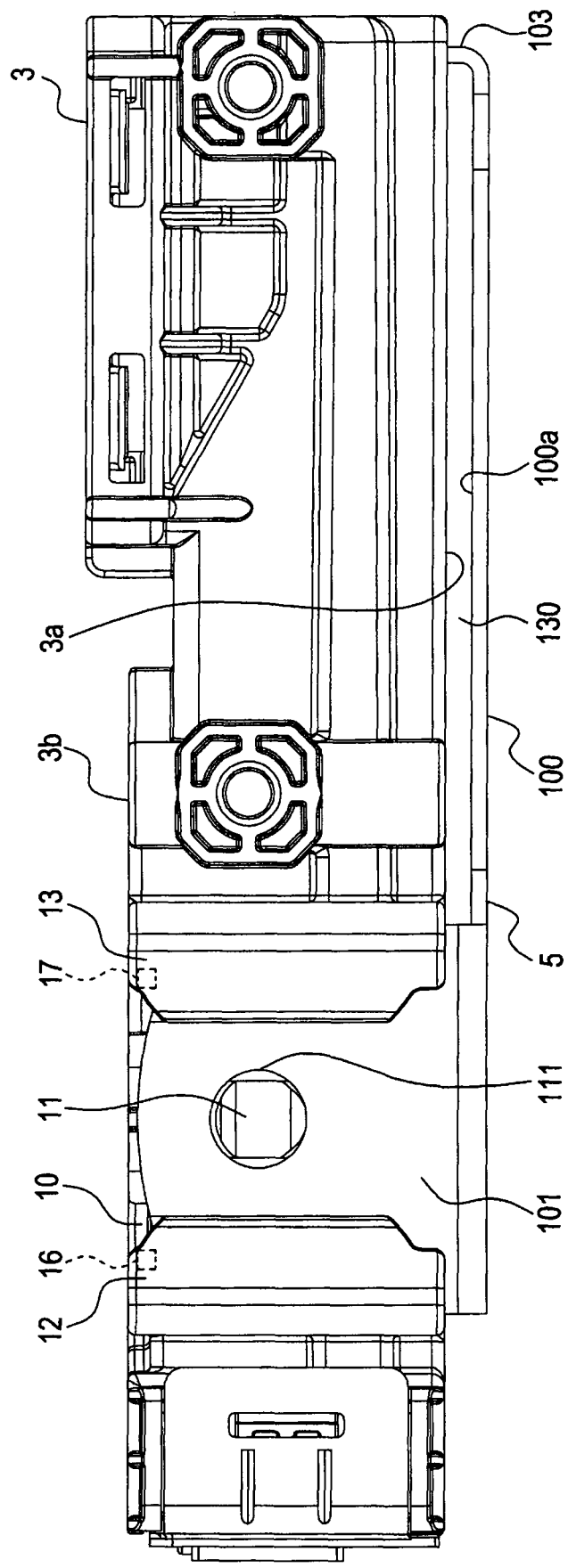
FIG. 10 is a view seen in an arrow direction X of FIG. 7.

When the attachment of the bracket 5 to the housing 3 is completed, as shown in FIG. 10 and FIG. 11, an opposing space 130 having a fixed interval is produced between the lower surface 3a of the housing 3 and the housing-opposing side 100a of the bracket 5. That is, the lower surface 3a of the housing 3 and the housing-opposing side 100a of the bracket 5 do not contact with each other, and are maintained in the separated state.

When attaching the housing 3 to a vehicle, the bracket 5 is attached directly to the vehicle. Since various concrete methods for attaching the bracket 5 to the vehicle are known, the explanation is omitted here.

In an actual attachment operation, for example, the bracket 5 is firstly attached to the vehicle, then, the housing 3 can be attached to the vehicle by attaching the housing 3 to the bracket 5. Alternatively, the bracket 5 is attached to the housing 3 in advance, and the housing 3 with the bracket 5 is attached to the vehicle.

(4) Detailed Structure of Holding Pin

Next, the configuration of each holding pin 11, 21, 31 is explained more concretely. Since the configuration is the same among the holding pins 11, 21, 31, the first holding pin 11 formed on the first side 6 is mentioned in detail as a representative, with reference to FIG. 12-FIG. 18.

Figure 16:
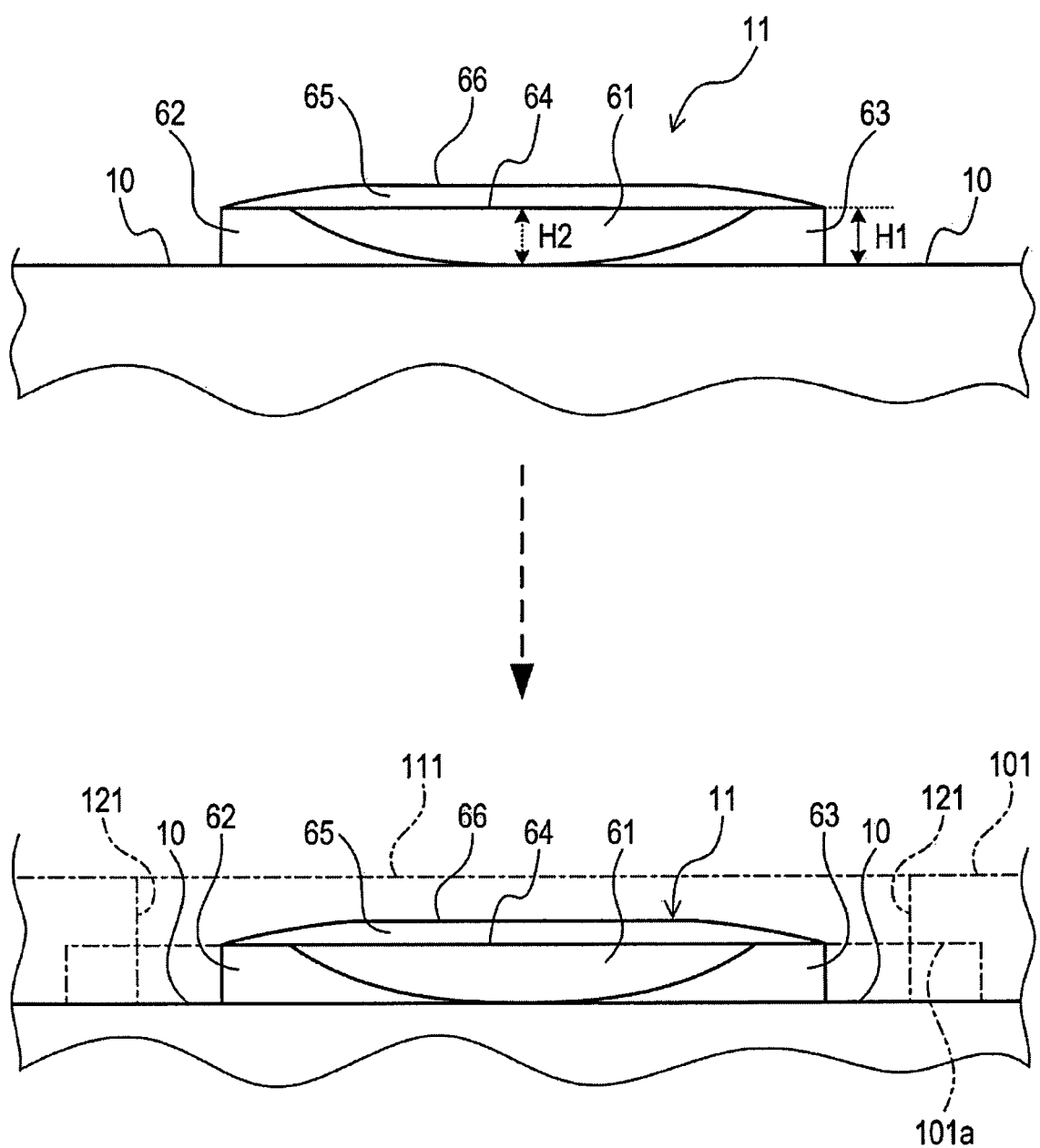
FIG. 16 is a cross-sectional view taken along a line XVI-XVI of FIG. 12.
Figure 17:
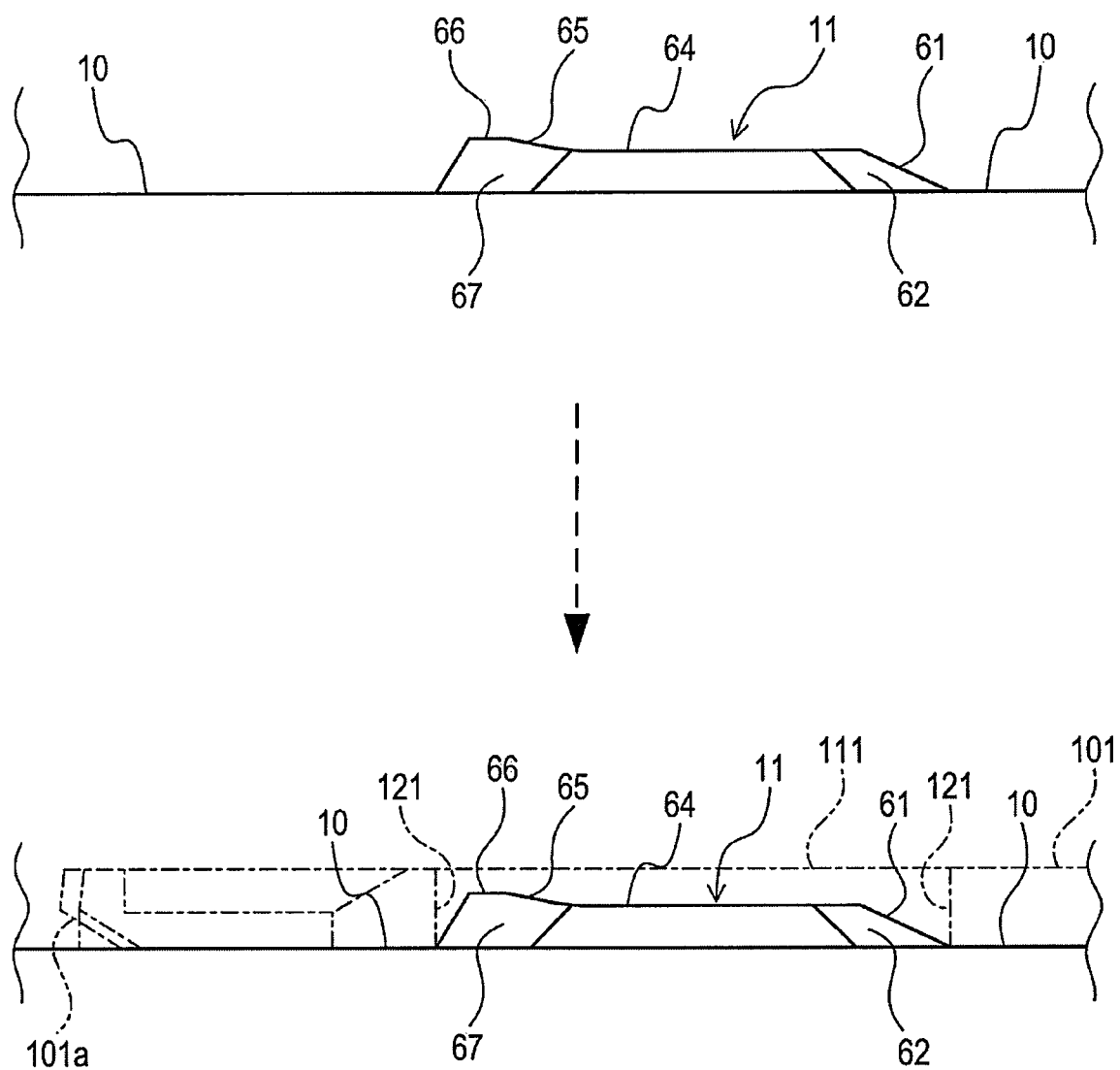
FIG. 17 is a cross-sectional view taken along a line XVII-XVII of FIG. 12.
Figure 18:
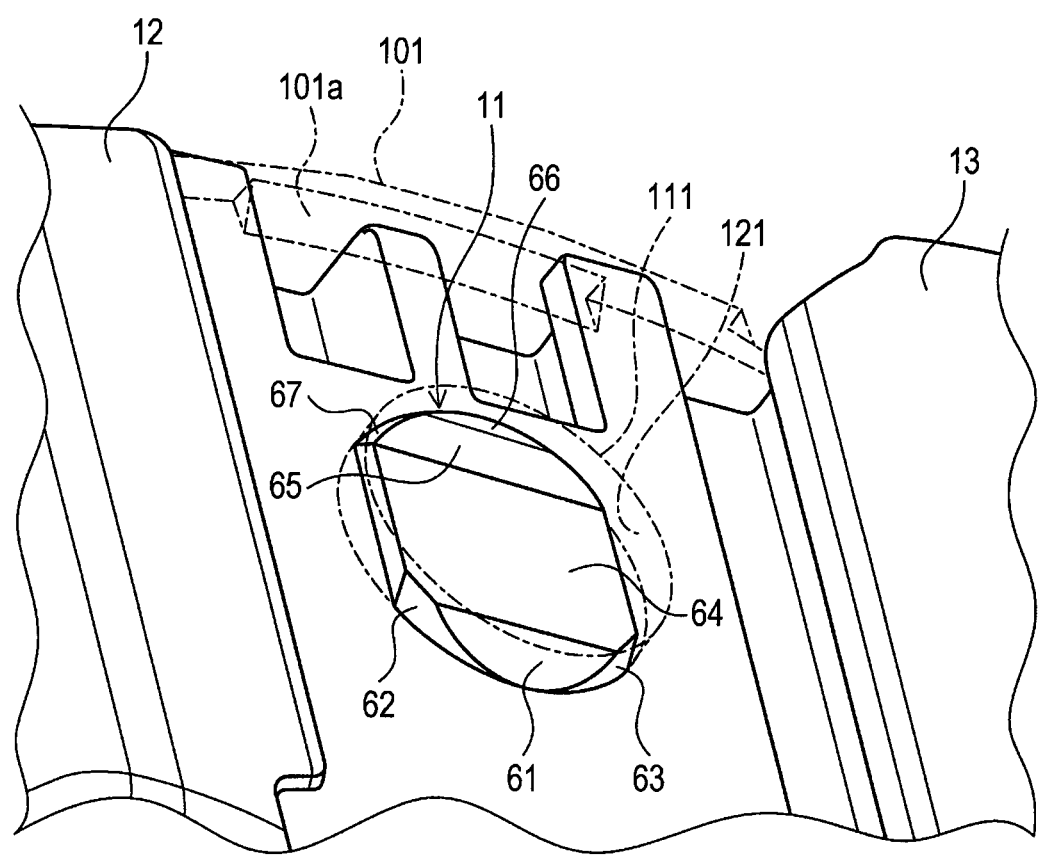
FIG. 18 is a perspective view illustrating the first holding pin and its neighborhood in the state where the bracket is attached.

In FIG. 16 and FIG. 17, the upper drawing represents a state where the bracket 5 is not attached to the housing, and the lower drawing represents a state where the bracket 5 is attached to the housing. The lower drawings of FIG. 16 and FIG. 17 schematically illustrate the first support component 101 of the bracket 5 using a single chain line. Moreover, FIG. 18 illustrates a state where the bracket 5 is attached to the housing. In FIG. 18, similarly to FIG. 16 and FIG. 17, the first support component 101 of the bracket 5 is schematically illustrated using a single chain line. That is, the lower drawing of FIG. 16, the lower drawing of FIG. 17, and FIG. 18 illustrate the first support component 101 of the bracket 5 with the single chain line, such that the state where the first side 6 of the housing 3 is seen through the first support component 101 is shown.

As shown in FIG. 12-FIG. 18, the first holding pin 11 has the inclined approach surface 61, two attachment holding surfaces 62 and 63, a top plane 64, an auxiliary slope 65, an auxiliary top plane 66, and a detachment holding surface 67.

When the bracket 5 is attached to the housing 3, the tip part of the first support component 101 of the bracket 5 firstly is in contact with the inclined approach surface 61. The inclined approach surface 61 is formed so that the height becomes higher from the end of the inclined approach surface 61 in the detachment direction Ddw as extending in the assembling direction Dup. Moreover, the inclined approach surface 61 is formed by one continuous plane as a whole.

An angle defined between the pin formation side 10 and the inclined approach surface 61, namely an approach inclination angle α (refer to FIG. 14) which is an inclination angle of the inclined approach surface 61 relative to the pin formation side 10 is, for example, less than or equal to 30 degrees in this embodiment. However, the approach inclination angle α may be larger than 30 degrees.

When the bracket 5 is attached to the housing 3, a portion of the tip part of the first support component 101 that is firstly in contact with the inclined approach surface 61 depends on the relation between the approach inclination angle α and an inclination angle of the tip slope 101a formed in the tip part of the first support component 101. When the approach inclination angle α of the inclined approach surface 61 of the first holding pin 11 is larger than the inclination angle of the tip slope 101a of the first support component 101, a possibility that the tip of the first support component 101 is in contact with the inclined approach surface 61 is high. When the approach inclination angle α of the inclined approach surface 61 of the first holding pin 11 is smaller than the inclination angle of the tip slope 101a of the first support component 101, a possibility that the tip slope 101a of the first support component 101 is in contact with the inclined approach surface 61 is high.

The two attachment holding surfaces 62 and 63 are formed to regulate the first support component 101 from further moving in the assembling direction from the fitting state where the first holding pin 11 is fitted to the first through hole 111 of the first support component 101.

The two attachment holding surfaces 62 and 63 can be seen when the first holding pin 11 is viewed in the assembling direction from the exterior, and are formed to oppose the inner peripheral surface 121 of the first through hole 111, when the first holding pin 11 is fitted to the first through hole 111. FIG. 18 illustrates the state where the inner peripheral surface 121 of the first through hole 111 and each of the attachment holding surfaces 62, 63 of the first holding pin 11 oppose to each other in the state where the first holding pin 11 is fitted to the first through hole 111.

When the bracket 5, which is assembled to the housing 3, moves in the assembling direction further to the housing 3, the inner peripheral surface 121 of the first through hole 111 of the first support component 101 is in contact with one or both of the attachment holding surfaces 62 and 63 of the first holding pin 11, so that the movement is regulated.

Each of the attachment holding surfaces 62 and 63 is projected from the pin formation side 10 so that a fixed holding inclination angle is defined. The holding inclination angle may be, for example, 90 degrees, but is smaller than 90 degrees in this embodiment. That is, the attachment holding surfaces 62 and 63 are formed to incline with the fixed holding inclination angle relative to the pin formation side 10. The holding inclination angle can be set suitably, but is necessary to be larger than the approach inclination angle $\alpha$ of the inclined approach surface 61 at least. In this embodiment, the holding inclination angle is 60 degrees or more, for example.

Figure 12:
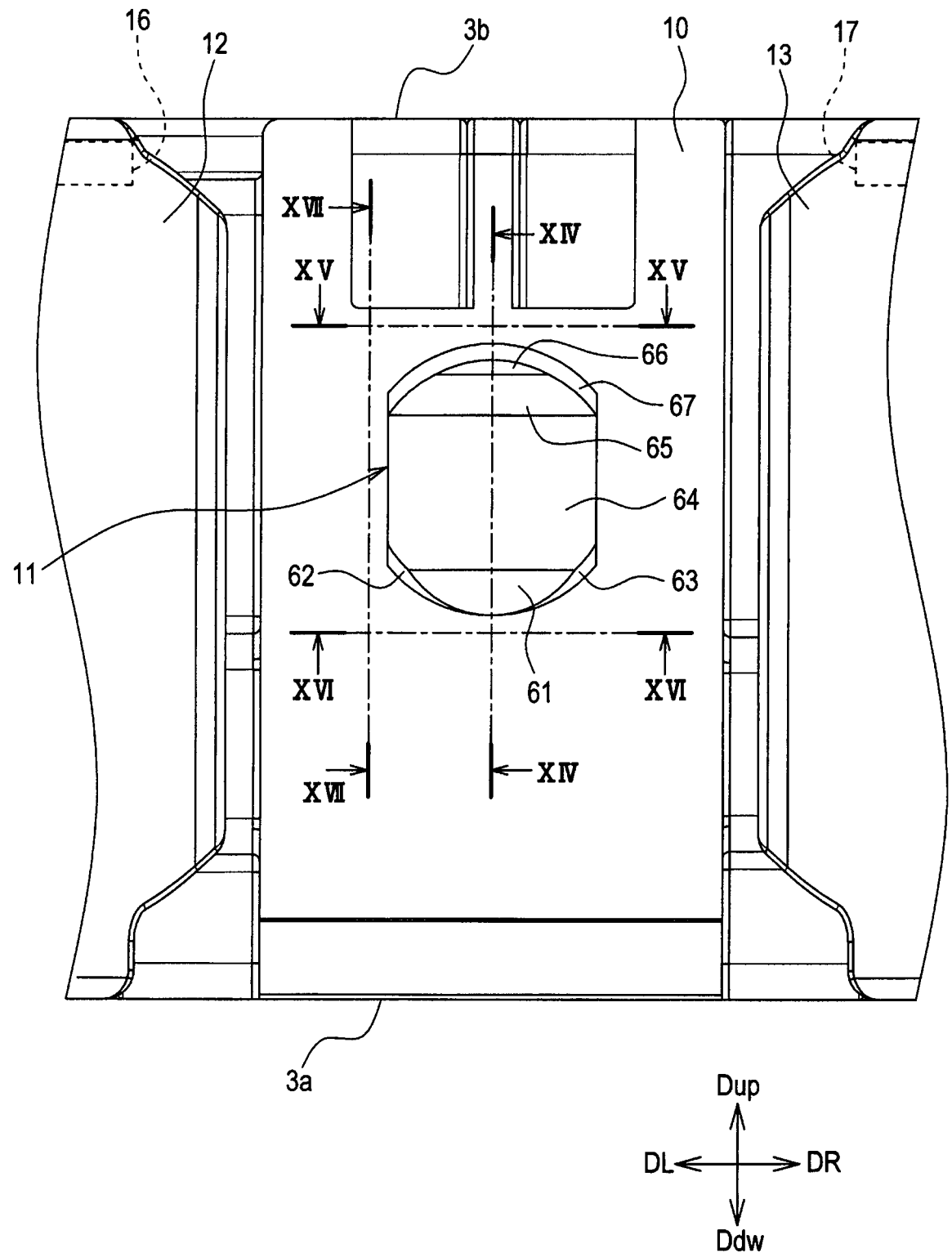
FIG. 12 is an enlarged side view illustrating a first holding pin on a first side of the housing.
Figure 13:
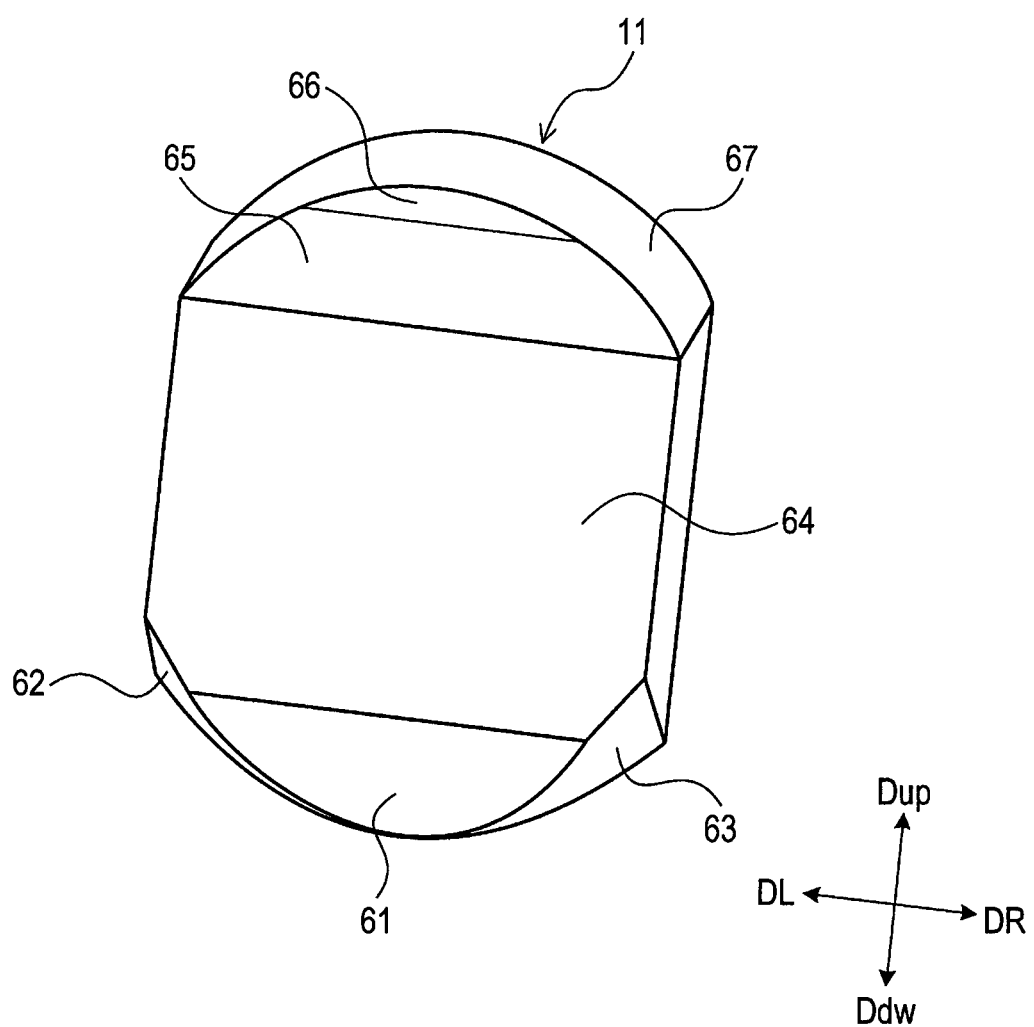
FIG. 13 is a perspective view illustrating the first holding pin.

Moreover, as clearly illustrated in FIG. 12, FIG. 13, and FIG. 16, when the first holding pin 11 is seen in the assembling direction from the exterior, the inclined approach surface 61 is located inside of both ends of the first holding pin 11 in the lateral direction. That is, the attachment holding surface 62 is ranged from the end of the inclined approach surface 61 on the left side DL to the end of the first holding pin 11 on the left side DL. Moreover, the attachment holding surface 63 is ranged from the end of the inclined approach surface 61 on the right side DR to the end of the first holding pin 11 on the right side DR. Therefore, when the bracket 5 is attached, the inner peripheral surface 121 of the first through hole 111 opposes each of the attachment holding surfaces 62 and 63 of the first holding pin 11 within the comparatively wide range.

Moreover, as shown in the upper drawing of FIG. 16, the height H1 of the top part of each attachment holding surface 62, 63 is the same as the height H2 of the top part of the inclined approach surface 61. Therefore, also in the height direction, the opposing range is fully secured between each attachment holding surface 62, 63 and the inner peripheral surface 121 of the first through hole 111.

The top plane 64 is a plane continuously formed from the top part of the inclined approach surface 61 in the assembling direction, and is a plane parallel to the pin formation side 10. In this embodiment, the auxiliary slope 65 and the auxiliary top plane 66 are formed to be still higher than the top plane 64. Therefore, when the bracket 5 is attached to the housing 3, in a process in which the tip part of the first support component 101 of the bracket 5 passes over the first holding pin 11, the tip part of the first support component 101 may be in contact with also the auxiliary slope 65. However, the first holding pin 11 is not limited to have the auxiliary slope 65 and the auxiliary top plane 66.

The detachment holding surface 67 is visible, when the first holding pin 11 is viewed from the exterior in the detachment direction, and is formed to oppose the inner peripheral surface 121 of the first through hole 111, when the first holding pin 11 is fitted to the first through hole 111. The lower drawing of FIG. 17, and FIG. 18 illustrate the state where the inner peripheral surface 121 of the first through hole 111 and the detachment holding surface 67 of the first holding pin 11 oppose to each other in the state where the first holding pin 11 is fitted to the first through hole 111.

When the bracket 5, which is assembled to the housing 3, moves in the detachment direction opposite to the assembling direction, to the housing 3, the inner peripheral surface 121 of the first through hole 111 of the first support component 101 is in contact with the detachment holding surface 67 of the first holding pin 11, so that the movement is regulated.

Figure 14:
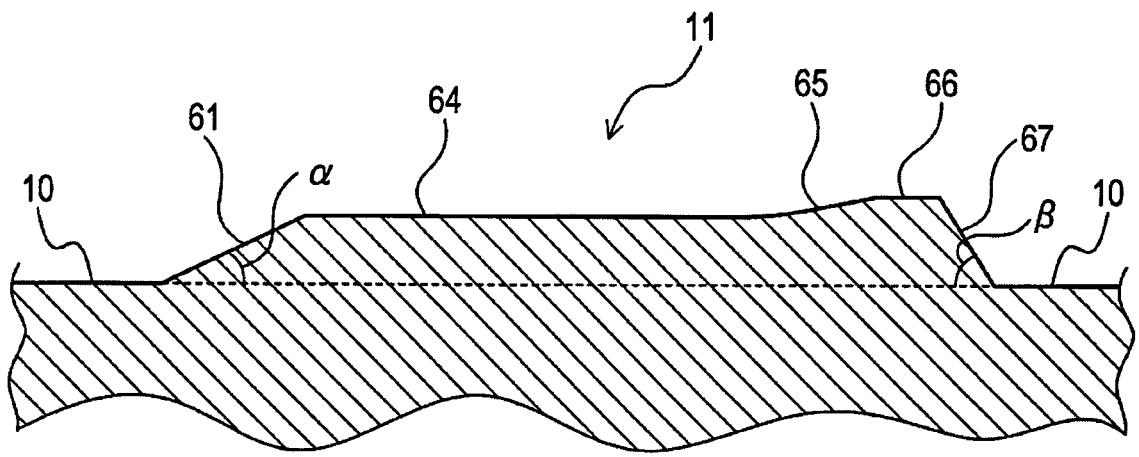
FIG. 14 is a cross-sectional view taken along a line XIV-XIV of FIG. 12.
Figure 15:
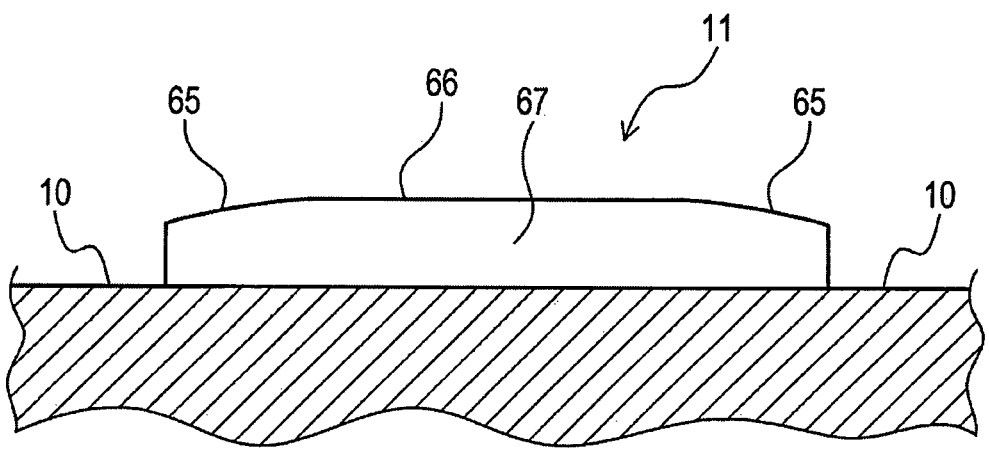
FIG. 15 is a cross-sectional view taken along a line XV-XV of FIG. 12.

The detachment holding surface 67 is projected from the pin formation side 10 to form a fixed detachment inclination angle $\beta$ (refer to FIG. 14). The detachment inclination angle $\beta$ may be 90 degrees. However, for example, in this embodiment, the detachment inclination angle $\beta$ is smaller than 90 degrees. That is, the detachment holding surface 67 is formed to incline with the fixed detachment inclination angle $\beta$ relative to the pin formation side 10. The detachment inclination angle $\beta$ can be set suitably, but is necessary to be larger than the approach inclination angle $\alpha$ of the inclined approach surface 61 at least. In this embodiment, the detachment inclination angle $\beta$ is 60 degrees or more, for example.

The concrete configuration of the first holding pin 11 is explained, and the second holding pin 21 and the third holding pin 31 have the same configuration as the first holding pin 11.

In addition, each of the holding pins 11, 21, 31 has a predetermined area on the pin formation side from which the holding pin is projected. Namely, the predetermined cross-sectional area of each of the holding pins 11, 21, 31 parallel to the pin formation side and on the same plane as the pin formation side (hereafter referred to shearing cross-section area) is set to sufficiently withstand a usual external shock. That is, the shearing cross-section area is secured such that the holding pin cannot be sheared by a large load that is generated to the holding pin by the bracket 5 in the assembling direction due to a usual-ranged external shock.

In addition, each holding pin 11, 21, 31 may be formed to satisfy at least one of the following two conditions a and b, for example.

a. The material strength of the holding pin is higher than a stress assumed to be applied to the holding pin when the shock is generated.

b. The fatigue strength of the holding pin is higher than a stress assumed to be applied to the holding pin by vibration of the vehicle.

The stress is determined by plural factors such as the whole weight of the housing 3 including the circuit board 150, the load, the installation position of the holding pin, the number of holding pins, and the positional relationship between the vehicle holding part and the housing 3. Therefore, for example, the stress applied to the holding pin can be predicted in consideration of some of the factors. The material strength and the fatigue strength, which are required for the holding pin at the minimum, can be calculated from the predicted value. The holding pin can be provided to satisfy the strength at least. That is, the number of the holding pins for the housing, and the shearing cross-section area of each holding pin may be set to satisfy at least one of the two conditions a and b. In addition, the two conditions a and b are examples, and there may be other different conditions. For example, the installation number of holding pins and the shearing cross-section area of each holding pin may be set to satisfy at least one of the conditions a and b and further at least another condition.

According to the housing-securing unit 1 of the embodiment, the following effects are acquired.

The first holding pin 11 has the inclined approach surface 61 where the height becomes higher as extending from the front end to the back end in the assembling direction. When attaching the bracket 5 to the housing 3, the tip part of the first support component 101 of the bracket 5 is in contact with the inclined approach surface 61 of the first holding pin 11, and passes over the first holding pin 11. Therefore, the assembling work of the bracket 5 can be done easily by moving the bracket 5 in the assembling direction relative to the housing 3.

Furthermore, the first holding pin 11 has the attachment holding surfaces 62 and 63. After the attachment of the bracket 5 is completed, even if the bracket 5 tries to move in the assembling direction further, the motion is regulated by the attachment holding surfaces 62 and 63. That is, even if the bracket 5 tries to move in the assembling direction further, the motion is regulated by the inner peripheral surface 121 of the first through hole 111 of the first support component 101 that is in contact with the attachment holding surface 62, 63 of the first holding pin 11.

Moreover, when attaching the bracket 5, the tip part of the first support component 101 of the bracket 5 is in contact with the inclined approach surface 61. Therefore, the attachment holding surfaces 62 and 63 can be restricted from wearing by the bracket 5 at the time of attachment work.

The same effect is acquired by the second holding pin 21 and the third holding pin 31 as the first holding pin 11.

Therefore, the workability for attaching the bracket 5 to the housing 3 can be maintaining good, and the assembly can be maintained appropriately after the bracket 5 is normally attached to the housing 3.

Moreover, as shown in FIG. 16, regarding the first holding pin 11, the height H1 of the top part of each attachment holding surface 62, 63 is the same as the height H2 of the top part of the inclined approach surface 61. Furthermore, in the lateral direction, the width of the inclined approach surface 61 (namely, the length in the lateral direction) is shorter than the width of the first holding pin 11, by which the width of each attachment holding surface 62, 63 is secured in the lateral direction. Further, the holding inclination angle of each attachment holding surface 62, 63 is larger than the approach inclination angle α of the inclined approach surface 61. Concretely, in this embodiment, the holding inclination angle is 60 degrees or more while the approach inclination angle α is 30 degrees or less.

Thereby, when the bracket 5 is attached to the housing 3, the inner peripheral surface 121 of the first through hole 111 opposes each attachment holding surface 62, 63 of the first holding pin 11 within the comparatively wide range. Therefore, a further fault penetration of the bracket 5 can be controlled effectively after the bracket 5 was attached to the housing 3.

The housing 3 may correspond to a substrate-accommodation housing. The first support component 101, the second support component 102, and the third support component 103 of the bracket 5 may correspond to a side support component. Each attachment holding surface 62, 63 of the first holding pin 11 may correspond to a first holding surface. The detachment holding surface 67 of the first holding pin 11 may correspond to a second holding surface.

The present disclosure is not limited to the above-mentioned embodiment, and can be implemented with various modifications as described below.

(1) The form of each holding pin 11, 21, 31 formed on the housing is not limited to the form shown in FIG. 12 and FIG. 13.

The bottom of each holding pin 11, 21, 31 of the embodiment is shaped in so-called corner-rounded rectangle, but may have other form (for example, a perfect circle, an ellipse, and a polygon).

Moreover, in the embodiment, the inclined approach surface 61 is formed of one continuous flat plane as a whole, but may have a curved surface form or a form in which a flat plane and a curved surface are combined.

Moreover, the changing rate in the height of the inclined approach surface 61 in the assembling direction is fixed in the embodiment, but is not limited to this. The inclined approach surface 61 may be formed where the height is raised, for example, quadratic functionally or logarithmic functionally. That is, the changing rate in the height of the inclined approach surface 61 may change continuously or intermittently.

The shape of the inclined approach surface 61 is not limited to the approximately semi-circle form in the embodiment, and may have other form. The width of the inclined approach surface in the lateral direction may be the same as that of the whole holding pin in the lateral direction. The number of attachment holding surfaces and the number of inclined approach surfaces are not limited to the number shown in the embodiment.

The height of the end of the inclined approach surface 61 in the detachment direction is zero in the embodiment. That is, the lower end of the inclined approach surface 61 is located on the same plate as the pin formation side 10. Alternatively, the lower end of the inclined approach surface 61 may be located in a position higher than the pin formation side 10.

Moreover, in the embodiment, as shown in the upper drawing of FIG. 16, the height H1 of the top part of each attachment holding surface 62, 63 is the same as the height H2 of the top part of the inclined approach surface 61. Alternatively, the height H1 of at least one top part of the attachment holding surfaces 62, 63 may be higher than the height H2 of the top part of the inclined approach surface 61.

(2) The cross-sectional form of the through hole for fitting the holding pin, formed in the bracket, is not limited to circle form like the embodiment. For example, when the perimeter form of the bottom of the holding pin is a polygon, the through hole may have the corresponding polygon shape in the cross-sectional form. The through hole may have various kinds of form such that a fault penetration of a bracket can be appropriately restricted from the state where the bracket is attached to the housing.

(3) The number of the holding pins formed on one housing may be set suitably. In the embodiment, the three holding pins 11, 21, 31 are formed on the housing 3, but the number of holding pins may be one, two, or four or more. The holding pin can be suitably formed on at least one of the sides of the housing, and the number of the holding pins formed on the one side can be suitably set. The housing is not limited to have the approximately rectangular parallelepiped form, and may have other form.

(4) In the embodiment, the three support components 101, 102, 103 having the same length are fixed integrally with the fixed component 100, as an example of a bracket, but are not limited to this. The bracket 5 is not limited so that the fixed component 100 is parallel to the lower surface 3a of the housing 3 in the state where the fixed component 100 is attached to the housing 3.

For example, the fixed component 100 may be not parallel with the lower surface 3a of the housing 3, in the attachment completion state. The support components do not need to have the same length. For example, the length of the first support component 101 may be longer than those of the support components 102, 103, such that the fixed component 100 is not parallel to the lower surface 3a of the housing 3 in the assembled state.

Moreover, for example, there may be no fixed component 100, and the support components 101, 102, 103 may be independent from each other. That is, a bracket may have at least one independent support component, and the at least one support component is individually attached to a housing. In that case, a support component will be individually attached to a vehicle.

The number of support components is not limited to three. That is, in the embodiment, the housing 3 has the three holding pins 11, 21, 31, and the bracket 5 has the three support components corresponding to the housing 3. The number of support components can be suitably set according to the number and the position of holding pins. For example, in case where the number of holding pins is one, the number of support components of the bracket may be one. For example, in case where the number of holding pins is two, the number of support components of the bracket may also be two.

When using three or more support components, at least two of them may be fixed integrally. For example, in the embodiment, two of the three support components 101, 102, 103 may be formed integrally through the fixed component 100, and the other one may be configured as one independent part.

(5) A function of one component in the embodiment may be distributed to plural components, and functions of plural components may be unified into one component. A part of the configuration of the embodiment may be eliminated, or may be added to or replaced with at least a configuration of the other embodiment. All the modes contained in a technical idea specified from claims are contained in the embodiment.

(6) The present disclosure is realized with various forms other than the housing-securing unit 1, such as the housing 3 of the housing-securing unit 1, or the bracket 5 of the housing-securing unit 1.

What is claimed is:

1. A housing-securing unit for a vehicle comprising:
a housing in which a circuit board is to be housed; and
a bracket configured to affix the housing to the vehicle by approaching a lower surface of the housing in a direction perpendicular to the lower surface, wherein
the housing has a plurality of housing sides perpendicular to the lower surface, at least one of the housing sides having a holding pin projected in a direction perpendicular to the housing side,
the bracket has a side support component shaped in a board in which a through hole is formed for fitting the holding pin,
the bracket is made to approach the housing in a state where the side support component is parallel to the housing side having the holding pin,
the bracket is configured to complete attaching to the housing such that a tip part of the side support component in an assembling direction is in contact with the holding pin and passes over the holding pin and that the holding pin is fitted into the through hole of the side support component,
the holding pin has
an inclined approach surface having a height that is increased as extending in the assembling direction, wherein the tip part of the side support component is firstly in contact with the inclined approach surface when the bracket is attached to the housing,
at least one holding surface formed to oppose an inner peripheral surface of the through hole and to regulate the side support component from further moving in the assembling direction when the holding pin is fitted to the through hole of the side support component, wherein the at least one holding surface is visible when being seen from outside in the assembling direction, and
a pair of side surfaces extending in a longitudinal direction of the holding pin, and the at least one holding surface is defined between the inclined approach surface and a respective side surface,
the at least one holding surface is different from the inclined approach surface,
the inner peripheral surface of the through hole is in contact with the at least one holding surface when the bracket is moved further in the assembling direction after the holding pin is inserted to the through hole, and
a height of a top part of the at least one holding surface is more than or equal to a height of a top part of the inclined approach surface.

2. The housing-securing unit according to claim 1, wherein
the holding pin further has a top plane which is parallel to the housing side and formed continuously from the top part of the inclined approach surface, and
the height of the top part of the at least one holding surface is the same as the height of the top part of the inclined approach surface.

3. The housing-securing unit according to claim 1, wherein
the inclined approach surface is a flat plane,
an inclination angle defined between the at least one holding surface and the housing side is constant, and
the inclination angle defined between the at least one holding surface and the housing side is larger than an inclination angle defined between the inclined approach surface and the housing side.

4. The housing-securing unit according to claim 1, wherein
the inclined approach surface is located inside of both ends of the holding pin in a lateral direction that is parallel to the housing side from which the holding pin is projected and that is perpendicular to the assembling direction, and
at least a part of the at least one holding surface is defined between a respective end of the inclined approach surface and a respective end of the holding pin in the lateral direction.

5. The housing-securing unit according to claim 1, wherein
the at least one holding surface is defined as a first holding surface,
the holding pin further has a second holding surface formed to oppose an inner peripheral surface of the through hole and to regulate the side support component from further moving in a direction opposite from the assembling direction when the holding pin is fitted to the through hole of the side support component, and the second holding surface is visible when being seen from outside in a detachment direction.

6. The housing-securing unit according to claim 5, wherein an inclination angle of the second holding surface relative to the housing side is larger than an approach inclination angle of the inclined approach surface relative to the housing side.

7. The housing-securing unit according to claim 1, wherein a bottom side of the at least one holding surface has an arc shape along the inner peripheral surface of the through hole.

8. The housing-securing unit according to claim 1, wherein the holding pin further has
  a first top plane continuously formed from a top part of the inclined approach surface in the assembling direction, the first top plane being parallel to the housing side,
  a second top plane parallel to the housing side and being higher from the housing side than the first top plane,
  a slope that is sloped between the first top plane and the second top plane in the assembling direction, and
  a detachment holding surface inclined downward from the second top plane to the housing side in the assembling direction.

9. The housing-securing unit according to claim 1, wherein a border between the inclined approach surface and the respective side surface has an arc shape.

10. A substrate-accommodation housing that houses a circuit board comprising:

a lower surface to which a bracket is to be assembled by approaching in a direction perpendicular to the lower surface;
a plurality of housing sides perpendicular to the lower surface; and
a holding pin disposed on at least one of the housing sides to be projected in a direction perpendicular to the housing side, wherein the bracket has a side support component shaped in a board to correspond to the holding pin,
the side support component has a through hole for fitting the holding pin,
the side support component approaches the substrate-accommodation housing in a state being parallel to the housing side having the holding pin,
the holding pin is fitted to the through hole of the side support component such that a tip part of the side support component in an assembling direction is in contact with the holding pin and passes over the holding pin,
the holding pin has
  an inclined approach surface having a height that is increased as extending in the assembling direction, wherein the tip part of the side support component is firstly in contact with the inclined approach surface when the bracket is attached to the housing,
  at least one holding surface formed to oppose an inner peripheral surface of the through hole and to regulate the side support component from further moving in the assembling direction when the holding pin is fitted to the through hole of the side support component, wherein the at least one holding surface is visible when being seen from outside in the assembling direction, and
  a pair of side surfaces extending in a longitudinal direction of the holding pin, and the at least one holding surface is defined between the inclined approach surface and a respective side surface,
the at least one holding surface is different from the inclined approach surface,
the inner peripheral surface of the through hole is in contact with the at least one holding surface when the bracket is moved further in the assembling direction after the holding pin is inserted to the through hole, and
a height of a top part of the at least one holding surface is more than or equal to a height of a top part of the inclined approach surface.

* * * * *